(12) United States Patent
Donnelly et al.

(10) Patent No.: US 10,109,671 B2
(45) Date of Patent: Oct. 23, 2018

(54) PHOTODIODE ARRAY STRUCTURE FOR CROSS TALK SUPPRESSION

(71) Applicants: Joseph P Donnelly, Carlisle, MA (US); K Alexander McIntosh, Groton, MA (US); Erik K Duerr, Groton, MA (US); William D Goodhue, Spencer, MA (US); Robert J Bailey, Methuen, MA (US); Lisa A Wright, Chelmsford, MA (US)

(72) Inventors: Joseph P Donnelly, Carlisle, MA (US); K Alexander McIntosh, Groton, MA (US); Erik K Duerr, Groton, MA (US); William D Goodhue, Spencer, MA (US); Robert J Bailey, Methuen, MA (US); Lisa A Wright, Chelmsford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/602,572

(22) Filed: May 23, 2017

(65) Prior Publication Data

US 2018/0040663 A1 Feb. 8, 2018

Related U.S. Application Data

(60) Provisional application No. 62/340,024, filed on May 23, 2016.

(51) Int. Cl.
*H01L 27/146* (2006.01)
*H01L 31/107* (2006.01)
(Continued)

(52) U.S. Cl.
CPC .. *H01L 27/14689* (2013.01); *H01L 27/11807* (2013.01); *H01L 27/14643* (2013.01);
(Continued)

(58) Field of Classification Search
CPC ........ G01J 2001/4466; H01L 27/11807; H01L 27/14643; H01L 27/14689;
(Continued)

(56) References Cited

U.S. PATENT DOCUMENTS 7,858,917 B2 12/2010 Stern et al.
8,426,797 B2 4/2013 Aull et al.
(Continued)

OTHER PUBLICATIONS

PCT/US2017/34092, PCT International Search Report, Form PCT/ISA/210 First sheet, second sheet, dated Jan. 2018.
(Continued)

*Primary Examiner* — Mark R Gaworecki
(74) *Attorney, Agent, or Firm* — Theresa A. Lober

(57) ABSTRACT

There is provided an avalanche photodiode array that includes a plurality of avalanche photodiodes. Each avalanche photodiode in the array includes a stack of active photodiode materials. The stack of active photodiode materials includes a first electrical contact layer, a second electrical contact layer; an absorber material layer and an avalanche material layer each disposed between the first electrical contact layer and the second electrical contact layer; and an optical interface surface to the avalanche photodiode. The optical interface surface consists of an exposed surface of the first electrical contact layer, arranged for incident external radiation to directly enter the first electrical contact layer. Each avalanche photodiode stack of active photodiode materials is laterally isolated from the other avalanche photodiodes in the photodiode array.

29 Claims, 13 Drawing Sheets

(51) Int. Cl.
*H01L 27/118* (2006.01)
*H01L 31/0352* (2006.01)
*G01J 1/44* (2006.01)

(52) U.S. Cl.
CPC ...... *H01L 31/03529* (2013.01); *H01L 31/107* (2013.01); *G01J 2001/4466* (2013.01); *H01L 2027/11892* (2013.01)

(58) Field of Classification Search
CPC ............ H01L 31/03529; H01L 31/107; H01L 2027/11892
See application file for complete search history.

(56) References Cited

U.S. PATENT DOCUMENTS

| | | |
|---|---|---|
| 2003/0047752 A1 | 3/2003 | Campbell et al. |
| 2004/0245592 A1 | 12/2004 | Harmon et al. |
| 2008/0012104 A1 | 1/2008 | Pauchard et al. |
| 2009/0081822 A1 | 3/2009 | Palsule et al. |
| 2009/0184317 A1 | 7/2009 | Sanfilippo et al. |
| 2011/0169117 A1* | 7/2011 | McIntosh ............ H01L 27/1446 257/432 |
| 2011/0169177 A1 | 7/2011 | McIntosh et al. |
| 2016/0181458 A1 | 6/2016 | McIntosh et al. |

OTHER PUBLICATIONS

PCT/US2017/34092, Written Opinion Of the International Searching Authority, Form PCT/ISA/237 cover sheet, Box No. 1 sheet, Box No. V sheet, Supplemental Box sheets 1-4, dated Jan. 2018.
Aull et al., "Geiger-Mode Avalanche Photodiodes for Three-Dimensional Imaging," Lincoln Laboratory Journal, vol. 13, No. 2, pp. 335-350, 2002.
Itzler et al., "Design and performance of single photon APD focal plane arrays for 3-D LADAR imaging," Proc. of SPIE vol. 7780, "Detectors and Imaging Devices: Infrared, Focal Plane, Single Photon," Derenjak et al., Eds., pp. 77801M-1-77801M-15, 2010.
Donnelly et al., "Design Considerations for 1.06-um InGaAsP—InP Geiger-Mode Avalanche Photodiodes," IEEE Jnl of Quantum Electronics, vol. 42, No. 8, pp. 797-809, Aug. 2006.

* cited by examiner

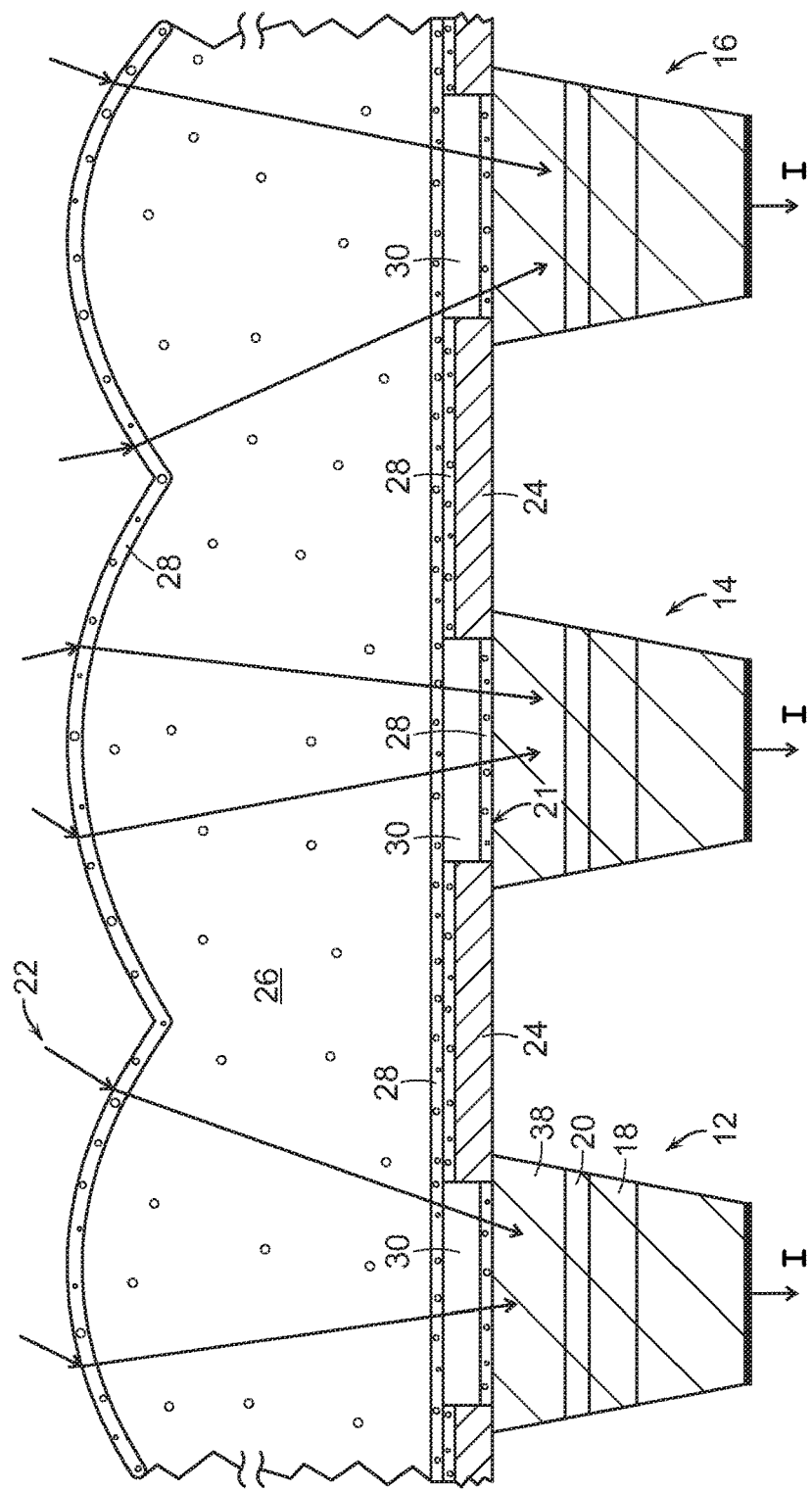

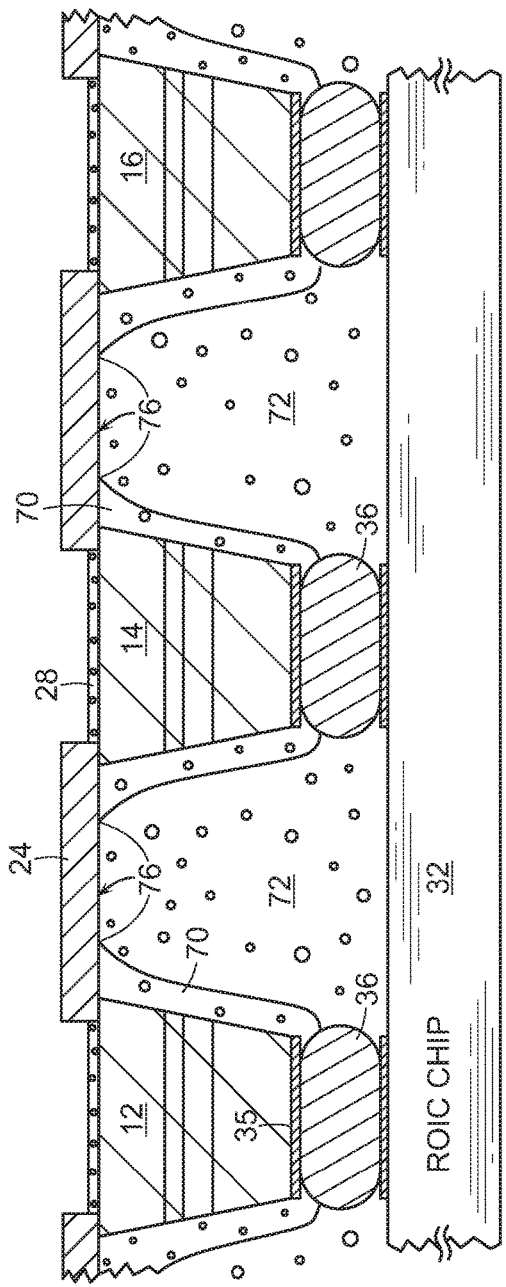
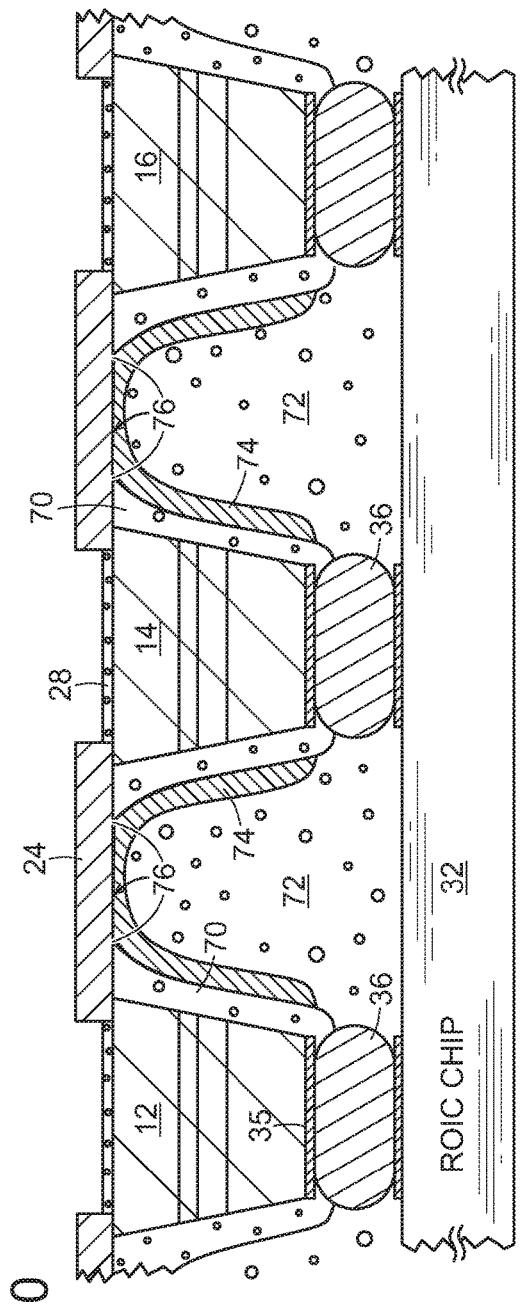

PHOTODIODE ARRAY STRUCTURE FOR CROSS TALK SUPPRESSION

CROSS-REFERENCE TO RELATED APPLICATIONS

This application claims the benefit of U.S. Provisional Application No. 62/340,024, filed May 23, 2016, the entirety of which is hereby incorporated by reference.

STATEMENT REGARDING FEDERALLY SPONSORED RESEARCH

This invention was made with Government support under Contract No. FA8721-05-C-0002, awarded by the U.S. Air Force. The Government has certain rights in the invention.

BACKGROUND

This invention relates generally to electronic photodiodes, and more particularly relates to avalanche photodiodes.

An electronic avalanche photodiode (APD) is a variation of a semiconducting p-n junction photodiode. An APD is operated-under reverse bias conditions that enable the absorption of an incident photon at the APD to produce secondary charges by impact ionization, lending the term "avalanche." One avalanche photodiode diode arrangement, known as Geiger-mode avalanche photodiode (GmAPD) operation, employs an avalanche photodiode that is strongly biased beyond the breakdown voltage characteristic of the photodiode to operate in a metastable state. Under this condition, the absorption by the photodiode of even a single photon can cause an avalanche event that gives rise to a detectable electrical current because the avalanche event can produce a voltage signal swing that is sufficient for directly driving CMOS digital logic. GmAPD operation can therefore achieve single-photon detection accuracy with sub-nanosecond time resolution. Imagers based on focal plane arrays (FPAs) of Geiger-mode avalanche photodiodes have demonstrated revolutionary laser radar and optical communication capabilities.

These capabilities are enabled in part by the ability to employ CMOS digital logic in an avalanche photodiode imaging system. For example, a FPA of GmAPDs can be bonded directly to CMOS readout integrated circuits (ROICs) that can be fabricated separately from the FPA. The use of an all-digital readout reduces power, and makes the APD technology more easily scalable to large array sizes than competing technologies employing, e.g., linear-mode APDs or photomultiplier tubes. A large-array GmAPD in which the photodiodes are relatively densely packed can be employed with CMOS ROIC technology to address a wide range of applications, e.g., in terrain mapping, airborne object identification, and communication in high-loss environments such as deep space and under water.

One limitation of a densely packed Geiger-mode APD array is optical cross talk between photodiodes in the array. When operated in or near Geiger-mode, an avalanching photodiode generates many highly energetic electron/hole charge carrier pairs. Some of these charge carriers lose energy by emitting, within the photodiode itself, a spectrum of photons of various wavelengths, some of which can be absorbed and detected at other photodiodes in the photodiode array. Such detection of photons that are secondary, i.e., produced at and coming from a photodiode in the photodiode array rather than from a source external to the array, cause false detection events across the photodiode array. Cross talk is the term used herein to describe this process of false detection across an APD array due to secondary photon emission and absorption.

Cross talk can at a minimum result in blurring of edges in images produced by a photodiode array, or even cause 'blinding' of the entire photodiode array so that no image can be produced. Further, as the sites of photodiodes in an array are moved more closely together, the degree and intensity of cross talk increases; low-pitch, high-density photodiode arrays are therefore significantly impacted by cross talk. As a result, as APD array size, array density, and array performance requirements grow, cross talk becomes increasingly limiting factor for achieving the most important applications for APD technology.

SUMMARY

To achieve suppression of cross talk caused by avalanche photodiodes, there is provided herein an avalanche photodiode array that includes a plurality of avalanche photodiodes. Each of the avalanche photodiodes in the array includes a stack of active photodiode materials including a first electrical contact layer, a second electrical contact layer, and an absorber material layer and an avalanche material layer each disposed between the first electrical contact layer and the second electrical contact layer. Each avalanche photodiode includes an optical interface surface to the avalanche photodiode. The optical interface surface consists of an exposed surface of the first electrical contact layer and is arranged for incident external radiation to directly enter the first electrical contact layer. Each avalanche photodiode stack of active photodiode materials is laterally isolated from the other avalanche photodiodes in the photodiode array.

The elimination of cross talk in the avalanche photodiode array enables significantly enhanced imager performance through increased detection efficiency, particularly because the avalanche photodiode array can be operated at an increased over bias condition without overwhelming the array with cross talk, and allows for increased sharpness in definition of features in 3D laser radar images. Furthermore, avalanche photodiodes in the array can be spaced quite closely without increasing cross talk. A wide range of advanced applications for single photon detection are thereby enabled by the avalanche photodiode array. Other features and advantages will be apparent from the following description and accompanying figures, and from the claims.

BRIEF DESCRIPTION OF THE DRAWINGS

FIG. 3 is a schematic cross sectional view of the three neighboring avalanche photodiodes of FIG. 1 shown mated with a microlens array for focusing external radiation to the photodiodes;

FIG. 9 is a schematic cross sectional view of the three neighboring avalanche photodiodes of FIG. 1 including a passivation layer and underfill between the photodiodes and an integrated circuit chip, with an aperture in the passivation layer for blocking optical cross talk through the passivation layer;

FIG. 10 is a schematic cross sectional view of the three neighboring avalanche photodiodes of FIG. 1 including a passivation layer and underfill between the photodiodes and an integrated circuit chip, with an aperture in the passivation layer for blocking optical cross talk through the passivation layer and a cross talk blocking layer intermediate to the passivation layer and underfill, between the photodiodes and an integrated circuit chip;

DETAILED DESCRIPTION

Figure 1:
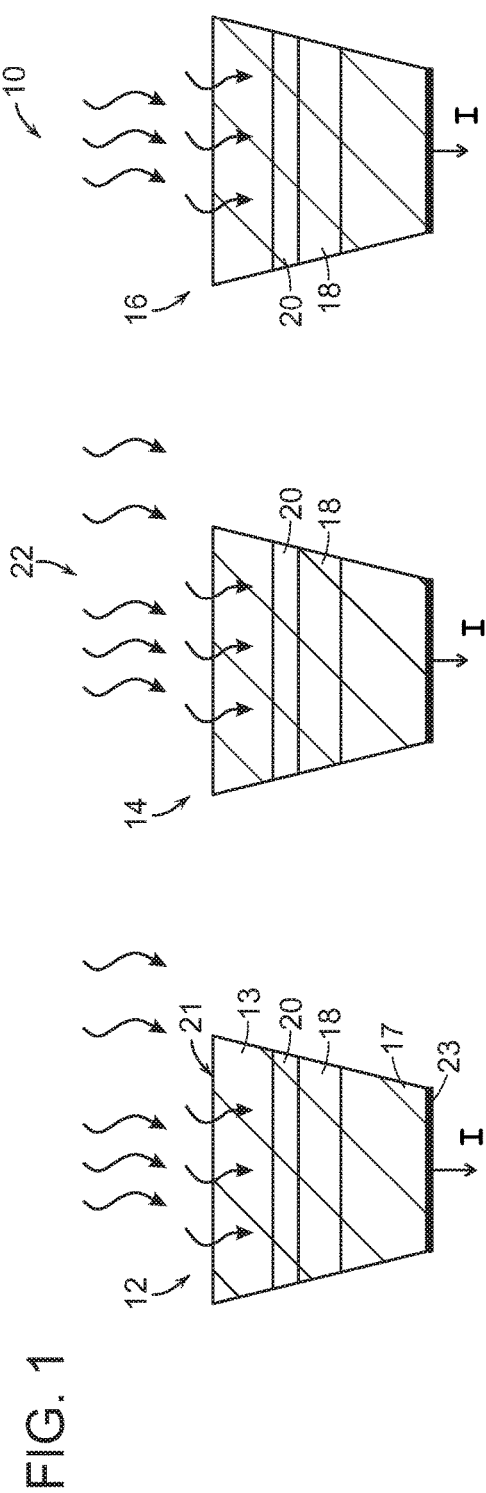
FIG. 1 is a schematic cross sectional view of three neighboring avalanche photodiodes in an array of photodiodes.

Referring to FIG. 1, there is schematically shown in cross-sectional side view three avalanche photodiodes in an array 10 of avalanche photodiodes. Three neighboring photodiodes 12, 14, 16, of the array of photodiodes are shown in FIG. 1. Each photodiode is a laterally isolated structure that includes a stack of active photodiode materials. The stack of active photodiode materials includes at least an absorber layer 18 that can absorb incoming radiation and an avalanche, or multiplier, layer 20, that produces electrical charge in response to the absorption of incoming radiation 22 into the absorber layer 18 the of photodiode. The absorber layer 18 and multiplier layer 20 are disposed between a first electrical contact layer 13 and a second electrical contact layer 17 to electrically bias the photodiode materials for avalanche photodiode operation.

Each photodiode includes an optical interface surface 21 and an output signal surface 23. The optical interface surface 21 is arranged to allow incident external radiation 22 to enter the isolated photodiode structure. In one embodiment, as shown, the optical interface surface 21 is an exposed surface of the first electrical contact layer 13. The output signal surface 23 is arranged, e.g., with the second electrically contact layer 17, to deliver an output signal, e.g., an electrical current signal, I, that is indicative of the external radiation absorbed into that physically isolated photodiode structure.

Figure 2A:
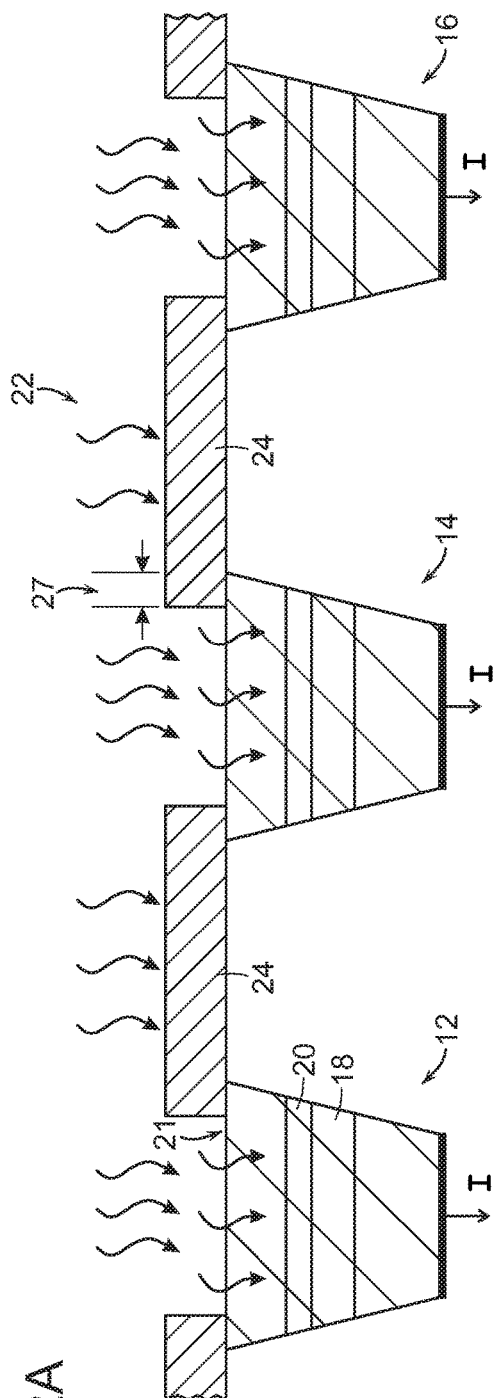
FIG. 2A is a schematic cross sectional view of the three neighboring avalanche photodiodes of FIG. 1 and including a material region adjacent to the photodiodes that blocks optical cross talk between neighboring photodiodes.
Figure 2B:
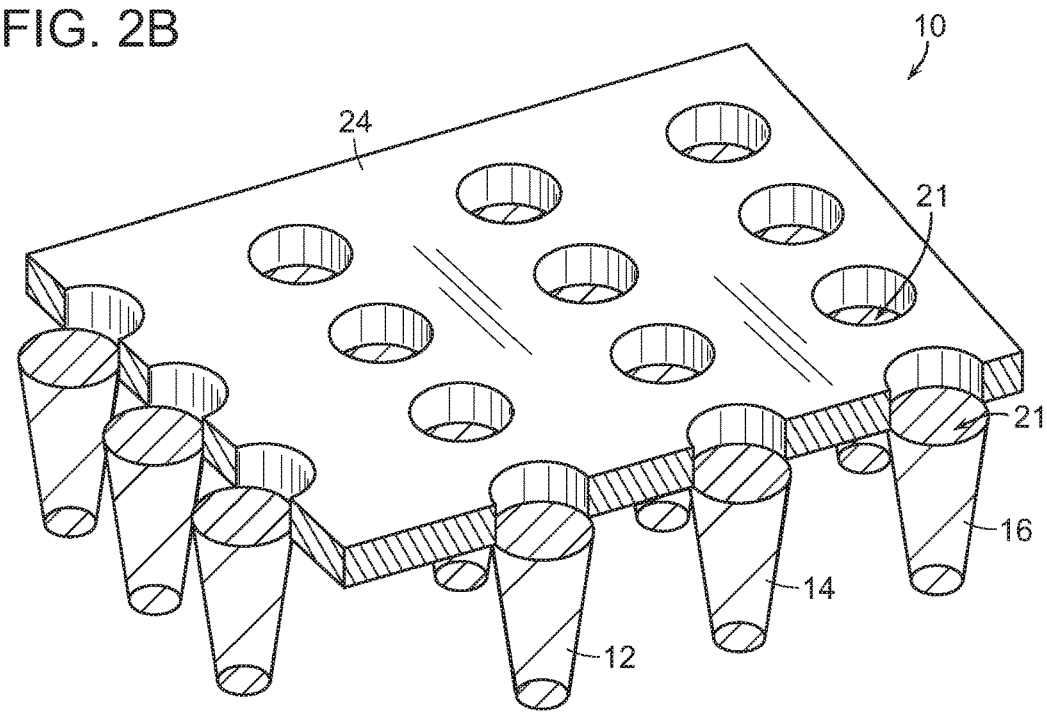
FIG. 2B is a schematic perspective view of an array of avalanche photodiodes including the three neighboring photodiodes of FIG. 1.

Referring to FIGS. 2A and 2B, there are shown cross-sectional and perspective views, respectively, the three physically isolated avalanche photodiodes 12, 14, 18 from FIG. 1 in the avalanche photodiode array 10. In one embodiment, a relatively thin region of material 24 is disposed at the vertical side of the photodiode array at which the optical interface surface 21 of the photodiodes exists. The region of material 21 is laterally adjacent to the optical interface surface of the photodiodes in the direction of incoming radiation and in one embodiment, as shown, laterally overlaps the edge of each photodiode by an overlap extent 27. This lateral overlap is not required for all embodiments.

The optical interlace surface 21 of each photodiode is thereby exposed and not covered by a region of material 24. As shown in FIG. 2B, in one embodiment, the material region 24 includes an array of apertures with locations corresponding to the array of photodiodes, so that incoming radiation can reach the photodiodes. Accordingly, the region of material 24 adjacent to the photodiodes does not hinder input radiation from reaching each photodiode, e.g., through an exposed surface of the first contact layer.

As shown in FIG. 2B, no stack of active photodiode material exists laterally between each of the photodiodes. No substrate region exists between photodiodes and any substrate material that was present between the photodiodes, e.g., during microfabrication, has been removed. Each photodiode, e.g., 12, 14, 16, is therefore laterally isolated, through the thickness of the stack of active photodiode materials of each photodiode, from all other photodiodes in the array. In other words, the material that forms each photodiode is not present laterally between the photodiodes through the thickness of the stack of active photodiode materials of the photodiodes.

Further, there is no substrate material vertically adjacent to each photodiode, either on the optical interface surface 21 of the photodiode or on the signal output surface 23 of the photodiode. Any substrate that was employed during microfabrication of the photodiodes, e.g., as starting material for epitaxial growth of photodiode layers, is not present in the photodiode array. Only material region 24 is present, adjacent to the photodiodes. With this configuration, the optical interface surface 21 is the exposed surface of the first conducting layer 13. Incident radiation directly enters this first conducting layer 13 without first traversing a substrate or other material.

Figure 2C:
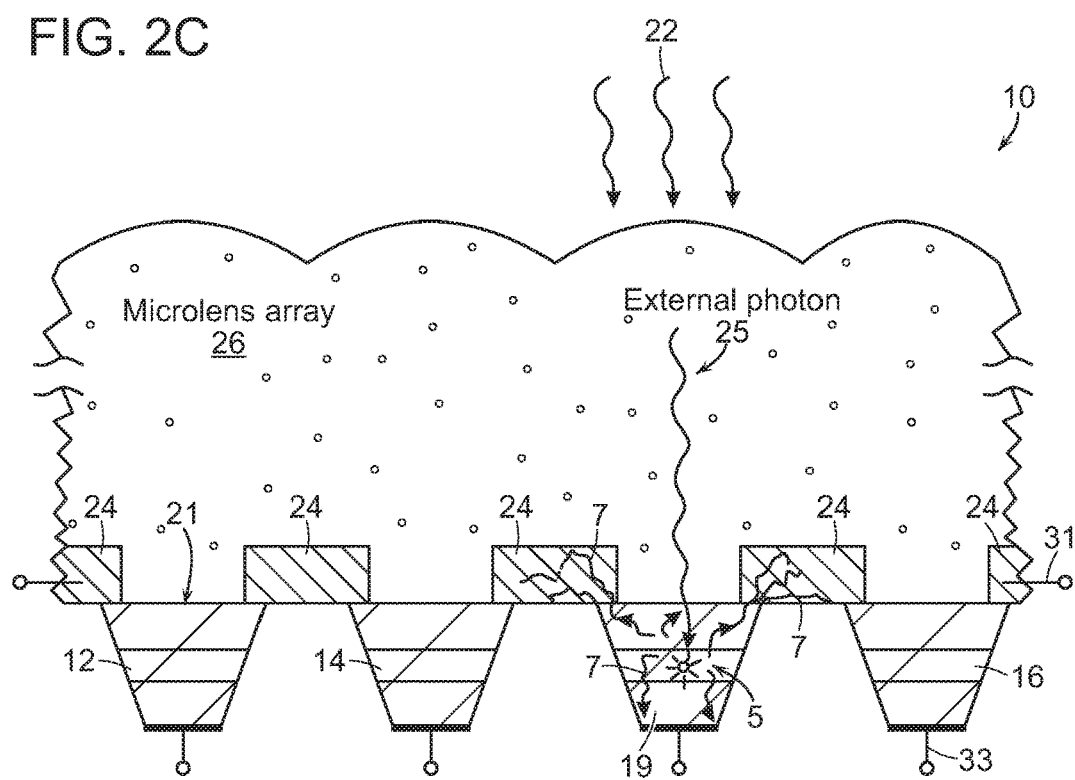
FIG. 2C is a schematic cross sectional view of the three neighboring avalanche photodiodes of FIG. 1 and an avalanching photodiode, with a material region blocking optical cross talk from the avalanching photodiode.

This photodiode array configuration enables nearly complete elimination of optical cross talk in the APD array during Geiger-mode operation of the array. In APD Geiger-mode operation, referring to FIG. 2C, the photodiode array is configured, to accept external radiation 22, with, e.g., a microlens array 28 provided for focusing external radiation to the photodiodes. With this configuration, external photons 23 are directed to photodiodes. In this condition, as shown in FIG. 2C, an external photon 23 is directed to a photodiode 19 in the array. Each photodiode is electrically biased to absorb external photons and in response, to produce an avalanche of electrical charge carriers for production of an electrical signal indicative of the photon absorption. This electrical bias can be achieved in any suitable manner.

In one embodiment, shown in FIG. 2C, the material region 24 that extends across the APD array makes electrical connection to each photodiode, e.g., at the first electrical contact layer 13 of each photodiode and is connected 31 as the anode for each photodiode. Each photodiode can have a separate cathode connection 33, e.g., to the second electrical contact layer 17, or other suitable connection. Each photodiode is therefore biased for APD operation, beyond the breakdown voltage of that photodiode to trigger avalanching electrical charge production in response to absorption of an incoming photon. This enables an APD output signal indicative of photon detection by the APD array. APD array bias, control, and output signal processing can be conducted in any suitable manner, e.g., as taught in U.S. Pat. No. 8,428,797, issued Apr. 23, 2013; and as taught in U.S. Pat. No. 7,858,917, issued Dec. 28, 2010, the entirety of both which are hereby incorporated by reference.

If an external photon 23 has an energy corresponding to the band gap energy of the absorber layer of a photodiode 19, that photon 23 is absorbed by the photodiode 19. The multiplier layer of the photodiode produces an avalanche event 5 in which electrical charge is produced by the photodiode 19. A fraction of the avalanching electrical charge loses energy within the photodiode material by emitting from the photodiode 19 so-called secondary photons 7 that are distinct from external photons 23 incoming to the photodiode array. The secondary photons comprise a broad-wavelength spectrum of radiation produced by the photodiode itself. If such secondary photons 7 were to be absorbed by other photodiodes in the array, a photon detection signal indicative of secondary photon absorption, rather than the external, primary photon absorption, would be produced. This triggering of photodiodes by secondary photons that are emitted by a neighboring photodiode is therefore caused by optical cross talk within the APD array.

As shown in FIG. 2C, with no photodiode active materials present laterally between neighboring photodiodes, secondary photons have no lateral path through substrate photodiode material. Further, with no substrate material present vertically beyond the photodiodes at the optical interface of the array, no substrate exists for transmission of secondary photons through the substrate between photodiodes, and no optically reflecting surface exists for total internal reflection of secondary photons from an avalanching photodiode through the substrate and back into the array. Thus, in the APD array, there is no substrate path outside of each photodiode that could enable cross talk of secondary photons between photodiodes. Any cross talk that would require an optical path through photodiode substrate material is eliminated in the APD array. This condition is particularly important for APD systems like InP-based systems in which a photodiode substrate material is transparent to secondary photon wavelengths that could cause avalanche events. In the APD array provided herein there is no substrate path between the photodiodes in the array.

In addition, in one embodiment, the material region 24 is a cross talk blocking layer that blocks secondary photons 7 from traveling between photodiodes in the array. Secondary photons 7 emanating from an avalanching photodiode 19 are absorbed by the cross talk blocking material region 24 or reflected by the cross talk blocking material region 24 back to the avalanching photodiode 19. The secondary photons do not travel from the avalanching photodiode 19 to neighboring photodiodes 14, 16 through the region 24. Instead, secondary photons are trapped by the cross talk blocking material region 24 where they are absorbed, or are reflected back to the avalanching photodiode 19 itself for trapping in the photodiode.

With this design, optical cross talk laterally across the APD array can be substantially completely eliminated with a combination of substrate removal, cross talk blocking material region disposition between photodiodes, and, as explained in detail below, the provision of cross talk blocking material between the isolated photodiodes. This elimination of cross talk in the APD array 10 enables significantly enhanced imager performance through increased detection efficiency, particularly because the APDs can be operated at an increased over bias condition without overwhelming the APD array with cross talk, and allows for increased sharpness in definition of features in 3D laser radar images. Furthermore, photodiodes can be spaced quite closely in the array. A wide range of advanced applications for single photon detection are thereby enabled by the APD array 10.

The cross talk blocking region of material 24 that is adjacent to the array of photodiodes is not a substrate, and as explained above, no photodiode substrate is provided on either top or bottom surface of the material 24. Indeed, as shown in the figures and explained above, no APD substrate is provided at any location of the APD array between photodiodes. As a result, the photodiode array consists of laterally isolated islands of active photodiode materials that are not supported on a conventional, much thicker microelectronic substrate that is typically hundreds of microns in thickness. External input radiation 22 that is incident on the array of photodiodes is directly absorbed into each photodiode, e.g., at the exposed surface of the first electrical contact layer, and does not first pass through a thick substrate or other material. Only active photodiode materials are included in the vertical stack of materials that are directly adjacent to the optical interface surface 21.

The cross talk blocking region of material 24 is preferably even thinner than the stack of material layers that form each photodiode; i.e., the photodiode vertical extent is greater than the thickness of the region of material 24, as shown in FIG. 2A. The cross talk blocking region of material is in general less than ten microns in thickness, and can be, e.g., between about 2000 Å-thick and about 30,000 Å-thick. The region of material 24 can be provided as a single layer of material or as multiple layers of materials, either homogeneous or inhomogeneous in composition through the layers and from layer to layer. The region of material 24 overlaps the edge of each photodiode by an overlap extent 27 that is sufficient to provide mechanical and additionally, optionally, electrical contact, with each photodiode.

Referring back to FIGS. 2A-2B, in one embodiment, the cross talk blocking region of material 24 adjacent to the array of isolated photodiodes blocks cross talk by absorbing at least a portion of the secondary photons that are produced by photodiodes. For example, the cross talk blocking region of material 24 can include a semiconducting material, with a selected doping concentration, if desired, having a band gap that absorbs at least some wavelengths of photons produced by photodiodes in the array. It is preferable that at least a portion of the range of secondary photon wavelengths that could cause avalanche of a neighboring photodiode be absorbed by the cross talk blocking material 24. In other words, it is preferable that secondary photons having wavelengths that could be absorbed by the band gap energy of the absorber material in photodiodes of the array be absorbed instead by the cross talk blocking material 24. With this condition, the cross talk blocking layer prohibits the triggering of neighboring photodiodes by secondary photons which would otherwise be absorbed by the neighboring photodiodes.

In one embodiment, the cross talk blocking region of material 24 is different than material employed as the photodiode avalanche layer material. In another embodiment, the region of material 24 is different than the material employed as the photodiode absorber layer material. The region, of material 24 can comprise or consist of a III-V semiconducting material or stack of such materials, or any suitable semiconducting material that can absorb photons produced by the avalanche layer of photodiodes in the array.

In one embodiment, the region of material 24 is an electrically conducting electrical contact layer, whereby the region of material 24 can be employed as an electrically conducting plane that makes electrical contact to all of the photodiodes in the array of photodiodes. This conducting plane further can block optical cross talk, as in the operation shown in FIG. 2C, e.g., by absorbing secondary photons. The extent of lateral overlap 27 between the region of material 24 and each photodiode, as shown in FIG. 2A, enables electrical contact between the region of material 24 and each photodiode. This can be employed, e.g., as the cathode connection to each photodiode. In a further embodiment, the cross talk blocking region of material 24 is electrically conducting and blocks cross talk by reflecting, rather than absorbing, at least a portion of the secondary photons that are produced by photodiodes. The cross talk blocking region of material 21 further can be categorized as being opaque to at least one or a range a range of wavelengths of secondary photons produced by photodiodes in the array.

In one embodiment, the region of material 24 is electrically conducting in that the region of material includes or consists of an electrically conducting material such as one or more layers of metal, metal alloys, doped semiconductors, or other electrically conducting material. The region of material 24 can include one or more electrically conducting layers along with other materials, e.g., one or more semiconducting or electrically insulating layers, so long as the electrically conducting layer makes contact to each APD for enabling electrical connection to each APD. Alternatively, the region of material 24 can consist entirely of one or more metal layers. The lateral overlap extent 27, FIG. 2A, between the region of material 24 and a photodiode is preferably sufficient to make full electrically conducting contact between the photodiode and the electrical conducting layer of the region of material 24. In one embodiment, with the region of material 24 making electrical contact to each photodiode in the array, the region of material provides a common anode for the photodiode array.

With the cross talk blocking region of material 24 disposed adjacent to the photodiode array, there is produced a focal plane array (FPA) of avalanche photodiodes for the which cross talk can be substantially completely eliminated. Considering the introduction of external radiation to the array in more specificity, and referring to FIG. 3, in one embodiment, a lens array 26 is positioned adjacent to the region of material 24. The lens array provides a microlens at the location of each photodiode in the array to focus external radiation 22 so that a cone of focused external radiation is directed to a corresponding photodiode. Without a microlens, each photodiode could be sensitive to external radiation incoming to the array from any angle; the microlens array excludes such background optical input from collection by the photodiode array. In addition, by focusing incoming radiation, the microlens array enables a reduction in the required photodiode size. It can therefore be preferred for most applications to configure the photodiode array with an adjacent microlens array, but such is not required.

Both surfaces of the lens array are preferably coated with an anti-reflection coating 28 so that external incident radiation does not reflect off of the surfaces of the lens and instead can enter the lens, focus through the lens' thickness, and exit the lens to the photodiode array. Similarly, the optical interface surface 21 of each photodiode is preferably coated with an anti-reflection coating 28 so that incident radiation does not reflect off of the surface of the photodiode and instead penetrates the active photodiode material. As explained above, the optical interface surface here remains exposed to incident radiation and radiation can directly enter the surface; the coating facilitates this condition. The surface of the region of material 24 can also include an anti-reflection coating 28. The resulting focal plane array does not include any substrate region in the optical path that exists between the external surface of the micro lens array and the vertical stack of photodiode materials.

Figure 4:
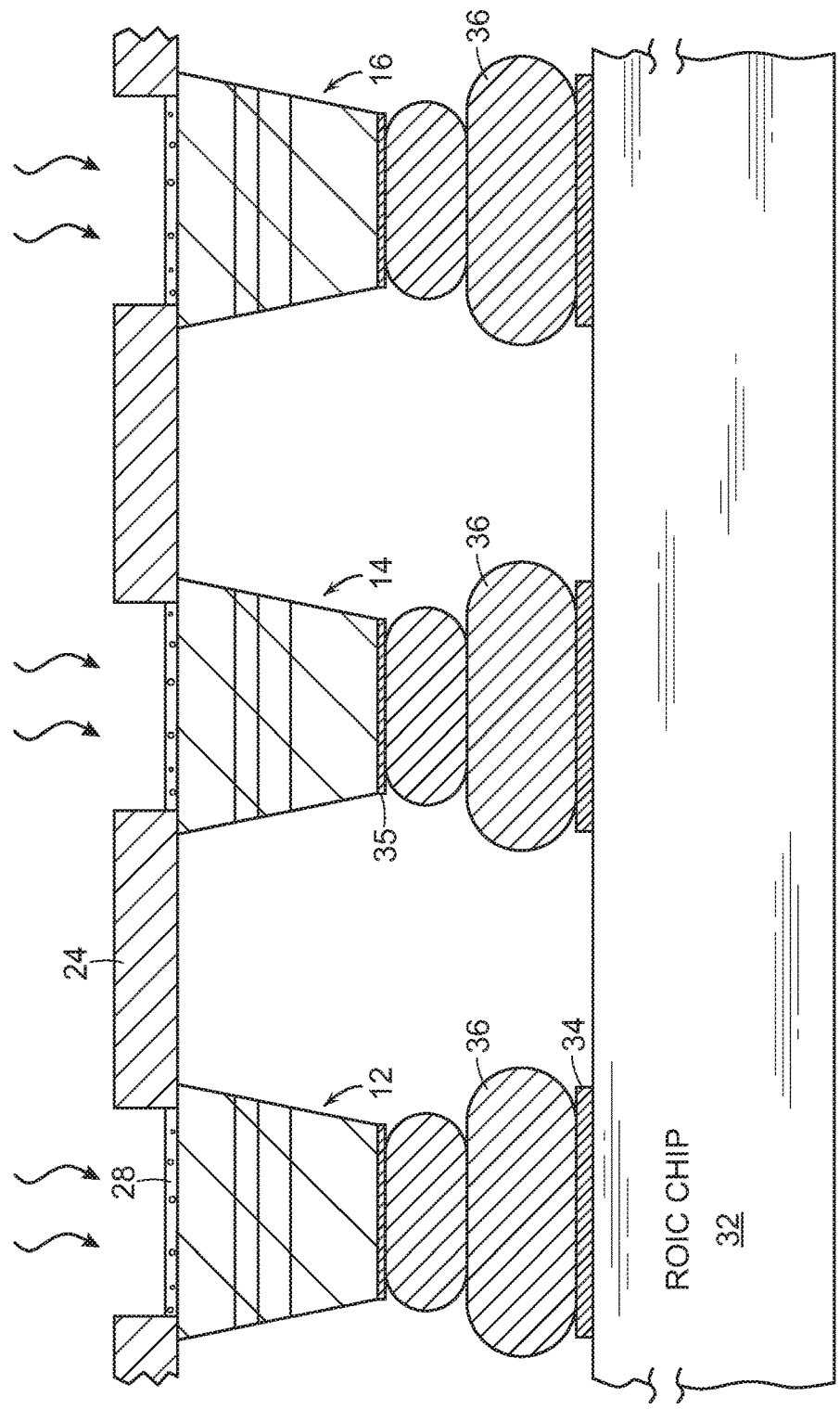
FIG. 4 is a schematic cross sectional view of the three neighboring avalanche photodiodes of FIG. 1 shown electrically bonded to an integrated circuit chip.

Referring to FIG. 4, in one embodiment, each physically isolated photodiode in the array is individually connected directly to circuitry, such as a CMOS photodiode read out integrated circuit (ROIC) on a microfabricated chip 32. In one embodiment, the microfabricated ROIC chip includes electrical contacts and bonding pads 34 that can be electrically connected to an electrically conducting contact 35 of each photodiode in the array with bump bonds 36, or other suitable electrical connection as is known in the art. With this connection, the ROIC can produce an electrical signal, such as an electrical current, that is indicative of photon detection, photon arrival time, and/or other information, for each photodiode in the array. The ROIC is provided in one embodiment as a microfabricated chip 32 that is interconnected to the focal plane array for direct delivery of electrical current from the photodiode array to the integrated circuit.

In the embodiment shown in FIGS. 2A-2C, FIG. 3, and FIG. 4, each photodiode does not include any substrate materials or material layers other than a stack of active photodiode layers, one or more electrical contacts, and optional antireflection coatings, as explained above. With this condition, then as shown in FIG. 3, the arrangement of a microlens array 26 at the photodiode array for focusing external radiation to array photodiodes results in the existence of hollow regions 30 adjacent to each photodiode at the optical interface surface 28. In one embodiment, the hollow regions 30 are void of any material whatsoever and include only air or another gas. In an alternative embodiment, the hollow regions 30 are provided with, e.g., a low-index oxide or other material that is not a photodiode substrate material. As a result, as explained above, no semiconducting substrate exists vertically beyond the active photodiode material at the optical interface surface 21; the optical interface surface is located directly at the active photodiode material. In other words, the material of each photodiode at the optical interface surface includes only active photodiode materials, electrical contact materials, or antireflection coatings.

The term 'active photodiode materials' here refers to materials that cooperate for the operation of a photodiode. This does not include a microelectronic wafer substrate or other starting material on which the photodiode may have been fabricated. For example, as shown in the figures, each stack of active photodiode materials in one isolated photodiode includes an absorber layer 18 and an avalanche layer, i.e., multiplier layer 20. These are the two material layers required for avalanche photodiode operation; the absorber layer 18 absorbs photons and the avalanche layer multiplies the number of free electrical charge carriers produced by the absorbed photon and that can be sensed to indicate the photon absorption.

In addition to the absorber layer and multiplier layer materials, the active photodiode materials included in a stack of active photodiode materials can include grading layers for transitioning through the stack between two different active materials, can include field stop layer materials, and can include other layers, e.g., for defining the electric field at the edge of the multiplier layer or other function such as making good electrical connection to the absorber and multiplier layers. The ordering of the active layers depends on a selected APD material system and APD design considerations, e.g., to avoid edge breakdown and to enforce a selected charge carrier type to initiate breakdown. The order of the absorber layer 20 and avalanche layer 18 can be reversed and the doping types reversed with selected APD designs and materials, and no particular APD stack arrangement is required.

The first electrical contact layer 13 (FIG. 1) includes the optical interface surface 21 at an exposed surface of the contact layer 13. The term 'exposed surface' is here meant to include a surface on which a coating, layer, or selected physical condition is provided for functionality of the surface as the optical interface surface 21. For example, the contact layer 13 can include one or more antireflection coatings or other material coating or layer for facilitating acceptance of incident external radiation into the contact layer. The contact layer surface remains exposed even with such coatings in that the contact layer 13 is the topmost material layer in the stack of active photodiode materials and no substrate or other active photodiode material is present atop the contact layer 13.

Figure 5:
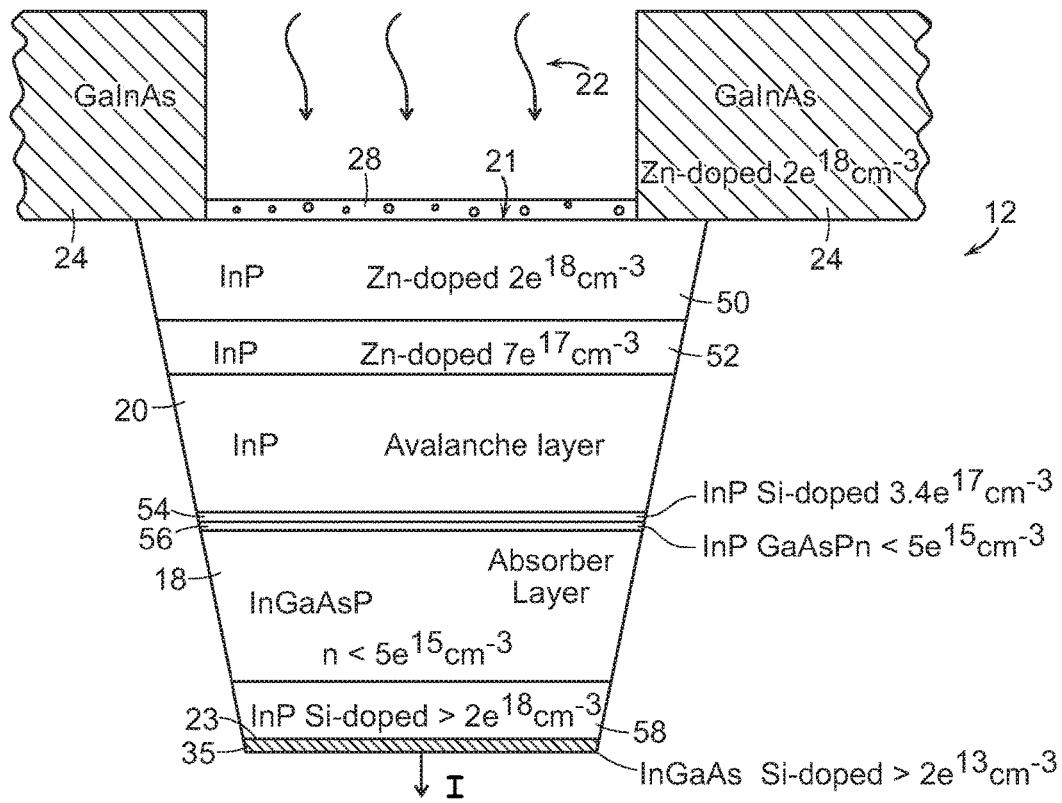
FIG. 5 is a schematic cross sectional view of an InP-based avalanche photodiode for IR photon detection and including a GaInAs material region for blocking optical cross talk from the photodiode.

In one embodiment, the materials in the stack of active photodiode layers are selected in concert with the materials of the cross talk blocking region of material 24 to eliminate cross talk in the APD array. FIG. 5 is a cross-sectional view of a photodiode 12 in an array of like photodiodes, including a cross talk blocking region of material 24 that overlaps edges of the photodiode 12. In this example, the photodiode includes an anti-reflection coating layer 28 of hafnium oxide of 136 nm in thickness. The anti-reflection coating layer is disposed on the optical interface surface 21 of the photodiode. This surface is at a layer 50 of InP having a thickness of about 10,000 Å and doped with Zn at a concentration of about $2e^{18}$ cm$^{-3}$ to form a p-type doped electrical contact layer that is the electrical contact layer 13 defined in FIG. 1. The next photodiode layer 52 is a 5000 Å-thick layer of InP doped with Zn at a concentration of about $7e^{17}$ cm$^{-3}$ to provide a p-type doped diffusion layer. The avalanche multiplying layer 20, of about 14,000 Å in thickness, is next disposed in the photodiode stack, with a carrier concentration, n, of n<$5e^{15}$ cm$^{-3}$. A field stop layer 54 is adjacent, to the avalanche layer 20 and provided as an InP layer of about 730 Å in thickness, doped with Si at a concentration of about $3.4e^{17}$ cm$^{-3}$. A grading layer 56 is next disposed in the photodiode stack as a 500 Å-thick InGaAsP layer having a carrier concentration of no more than about $5e^{15}$ cm$^{-3}$. The photodiode absorber layer 18 is disposed as a layer of InGaAsP of about 15,000 Å in thickness and having a carrier concentration of no more than about $5e^{15}$ cm$^{-3}$. An adjacent layer 58 of InP of about 5,000 Å in thickness and that is Si-doped with a concentration of about $2e^{18}$ cm$^{-3}$ is next provided and is an n-type doped contact layer. Finally, an electrical contact 35 is provided at the signal output surface 23 of this InP layer 58, as a 100 Å-thick layer of InGaAs that is Si-doped doped at a concentration greater than $2e^{18}$ cm$^{-3}$ as the second electrical contact layer 17 defined in FIG. 1.

This example photodiode configuration includes an InGaAsP absorber material layer 18 having a band gap wavelength of about 1100 nm+/−5 nm; i.e., the InGaAsP absorber material has a band gap energy that enables absorption of photons having a wavelength shorter than about 1100 nm+/−5 nm. An array of these photodiodes 12 provides operation as a high efficiency detector of incident infrared radiation at about 1064 nm.

In one embodiment of this photodiode shown in FIG. 5, the cross talk blocking material, region 24 is a layer of GaInAs with Zn doping at a concentration of $2e^{18}$ cm$^{-3}$ and having a thickness of about 20,000 Å. This GaInAs layer has a band gap wavelength near 1650 nm. Secondary photons emitted by the InP avalanche multiplication layer 20, during a charge carrier avalanche event, which have wavelength less than about 1650 nm are absorbed by the material region 24. As a result, the cross blocking material region 24 blocks secondary photons that could trigger an avalanche event at photodiodes neighboring an avalanching photodiode.

This example embodiment illustrates a condition in which the material region 24 is selected to absorb wavelengths of secondary photons produced by an avalanching photodiode that could cause a faulty avalanche event if absorbed at other photodiodes in an array. This absorption removes secondary photons from a lateral path between photodiodes through material region 24. Thus, in a particular embodiment, the cross talk blocking material region 24 is a semiconducting material having a bandgap that absorbs photon wavelengths in a spectrum of wavelengths from some wavelength longer than the wavelength that could cause an avalanche event to shorter wavelengths. In this embodiment, as shown in FIG. 5, the material region 24 is sufficiently electrically conducting to form an electrical contact to each APD in the array.

In additional embodiments, the material region 24 is electrically conducting, e.g., as a metal or metal alloy, such as, e.g., Ti, Ni, Au, Pt, Pd, Zn, and any suitable combination. The material region 24 alternatively can be provided as an electrically insulating material, such as EPO-TEK 320, Epoxy Technology, Inc., Billerica, Mass. In this embodiment, an electrically conducting material layer can be provided with the electrically insulating material to enable electrical contact to the array of APDs. In either of these cases, the material region 24 is a material that absorbs secondary photons emitted, from a photodiode. It is preferred, as given above, that the material region, whether electrically insulating or conducting, or semiconducting, absorbs secondary photons having wavelengths that could cause an avalanche event at a photodiode in the photodiode array.

As explained above, in a further embodiment, the cross talk blocking material region 24 is a material that reflects, rather than absorbs, secondary photons. In this condition, the material region can reflect back to an avalanching photodiode those secondary photons that are produced by the photodiode. This secondary photon reflection back to the avalanching photodiode is inconsequential because the avalanching photodiode has absorbed an external photon, and is correctly producing a detection signal anyway. Materials such as, e.g., Au, Ag, Al, Cu, or other materials can here be employed.

With these examples it is shown that the cross talk blocking material region 24, whether reflecting or absorbing, is in general a block to optical cross talk that could occur due to the lateral excursion of photons in at least a range of photon wavelengths, between photodiodes in the photodiode array. Not all secondary photons need to be blocked, only those photons having a wavelength that could cause an avalanching event need to be blocked. Thus, the material region 24 in one embodiment blocks at least some range of wavelengths of secondary photons that are emitted from a photodiode during an avalanche event, and preferably blocks those secondary photon wavelengths that could cause an avalanche event at a neighboring photodiode.

As explained above, in one embodiment, the material region 24 is sufficiently electrically conducting to make electrical connection to the optical interface surface 21 of the photodiodes in an array of photodiodes. For example, given a material region 24 of InGaAs with a Zn-doping concentration of $2e^{18}$ cm$^{-3}$, the material region 24 is sufficiently electrically conducting to provide an electrical connection to each photodiode. Then as shown in FIG. 2B, the material region 24 can operate as the plane of a common anode connection for an entire photodiode array.

If the material region 24 is not sufficiently electrically conducting to make electrical connection, to the optical interface surface 21 of the photodiodes in an array of photodiodes, then an electrically conducting layer, such as a heavily-doped semiconducting layer and/or one or more conducting metal layers, can be employed. For example, if a selected absorbing material region 24 is particularly preferred for its ability to absorb secondary photons but is not sufficiently electrically conducting, then one or more electrically conducting materials can be included in contact with each photodiode, with the absorbing layer atop the conducting layer or layers.

Figure 6:
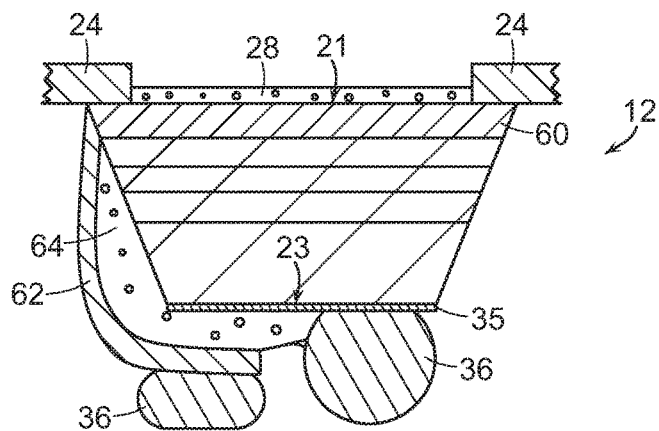
FIG. 6 is a schematic cross sectional view of an avalanche photodiode including individual anode and cathode electrical connections to the photodiode.

In an alternative embodiment, shown in FIG. 6, a photodiode 12 can include both of its own individual electrical connections, thereby eliminating the need for a shared electrical contact to the optical interface surface across the APD array. In one example of such, the photodiode 12 includes an electrical contact layer 35 provided at the signal output surface 23 in the manner described above as a cathode. A second electrical contact layer 60 is provided at the opposite end of the photodiode, and can be formed of the same material as the first electrical contact layer 35. The second electrical contact, layer is then the outermost layer of the photodiode at the optical interface surface 21. The antireflection coating 28 is then provided on the second electrical contact layer 60. The second electrical contact layer material must be transparent to incident radiation wavelengths of interest so that the photodiode can absorb the radiation for detection therein. This second electrical contact layer can be extended slightly in the lateral direction to increase ease of electrical contact to the layer.

An electrical connection 62 is made from the second electrical contact layer to the signal output side of the photodiode, and is electrically isolated from the photodiode materials by, e.g., an electrically insulating passivation material 64. A bump bond 36 or other suitable connection is provided from the first electrical contact layer 35 and separately from the electrical connection 62 to the second electrical contact layer 60. With this arrangement, the photodiode 12 can be independently and separately connected to a circuit for independent bias and control of the photodiode as well as output of the photodiode detection signal.

In one embodiment, the electrical connection 62 is configured as a cross talk blocking region. Here, the electrical connection 62 is formed of a material that absorbs secondary photon emission from the photodiode 12, or is formed of a material that reflects secondary photon emission from the photodiode 12 back into the photodiode itself. The electrical connection 82 thereby operates to block secondary photon emission produced by the photodiode 12. In a further embodiment, the electrical connection and underlying passivation layer laterally surround the photodiode 12. With the electrical connection 62 formed of a cross talk blocking material, the electrical connection 62 here operates to substantially completely block secondary photons from being emitted from the photodiode 12. As a result, the cross talk blocking material regions 24 are not required in this embodiment for inhibiting cross talk. The material regions 24 can here be employed, if desired, e.g., as an electrical contact layer, as an aid in positioning the FPA of photodiodes, or for other purpose, but is not required.

Figure 7:
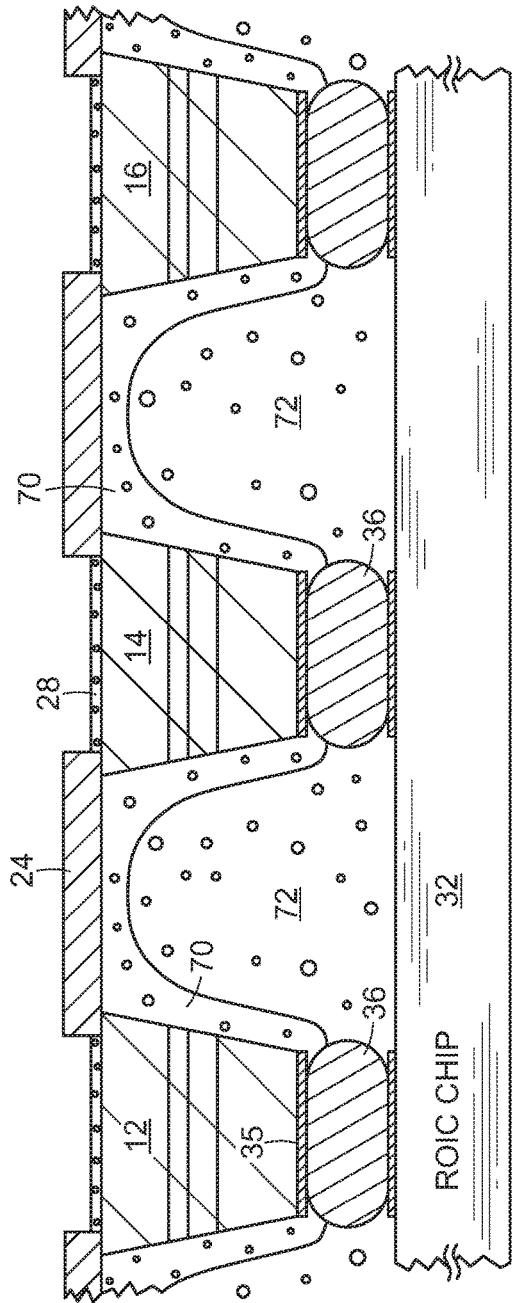
FIG. 7 is a schematic cross sectional view of the three neighboring avalanche photodiodes of FIG. 1 including a passivation layer and underfill between the photodiodes and an integrated circuit chip.

Whatever photodiode electrical connection arrangement is selected, when an array of photodiodes is mated with a microfabricated chip to connect the photodiodes to the IC of the chip, passivation and underfill materials are provided at the photodiode array to electrical insulate the photodiodes and to provide mechanical and environmental protection. In one embodiment, shown in cross section in FIG. 7, a passivation layer 70 is disposed on the sidewalls of each material stack of a photodiode 12 and along the surface of the material region 21. The passivation layer does not inhibit exposure of the photodiode contact layer 35 for making electrical connection with a chip 32 by way of bumps 30 or other connection. An underfill material 72 is disposed between the passivation layer and the chip 32.

The passivation material can be provided as, e.g., a polymer material such as polyimide or SU8. Alternatively, the passivation material can be provided as an electrically insulating dielectric such as silicon nitride or silicon dioxide, or as an insulating crystalline material such as a semiconductor like InP or InGaAs. The passivation layer 70 can be as thin as 0.1 microns or as thick as several microns, and can be even thicker than the total thickness of the photodiode active layer stack of materials. The underfill material can be provided as, e.g., an epoxy, such as EpoTek 320 or EpoTek 353ND, both from Epoxy Technology, Inc., Billerica, Mass.

In one embodiment, at least one of the passivation layer 70 and the underfill 72, or both the passivation layer 70 and the underfill 72, block secondary photons that are emitted from a photodiode 12. For example, the passivation materials InP and InGaAs described above can be employed to absorb secondary photons emitted from a photodiode. Similarly, the underfill material EpoTek 320 described above can be employed to absorb secondary photons emitted from a photodiode. In this embodiment, the passivation, and/or underfill, materials operate to block secondary photons that could travel through the passivation and underfill materials from one photodiode to neighboring photodiodes in an array.

Figure 8:
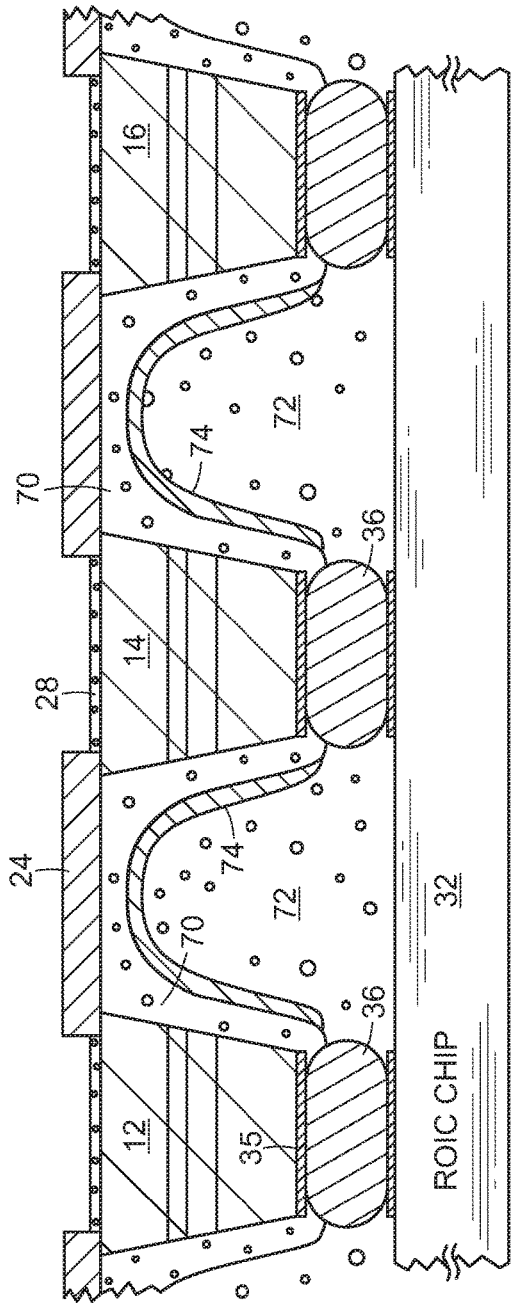
FIG. 8 is a schematic cross sectional view of the three neighboring avalanche photodiodes of FIG. 1 including a passivation layer and underfill with a cross talk blocking layer intermediate to the passivation layer and underfill, between the photodiodes and an integrated circuit chip.

Referring to FIG. 8, in a further embodiment, there can be included one or more coatings of a cross talk blocking layer 74 of material disposed between the passivation layer 70 and the underfill 72. This cross talk blocking layer preferably includes at least one material that absorbs or reflects secondary photon emission from photodiodes. A metal layer stack including, e.g., Ti and Ni, preferably oxidized, is an example of such a cross talk blocking layer 74. Other materials can be employed here. With this arrangement, the passivation layer 70 and the underfill 72 need not be blocking to secondary photon emission from the photodiodes in an array. Instead, the cross talk blocking layer 74 operates to block the path of photons laterally between neighboring photodiodes, either by reflecting the secondary photon emission hack to originating photodiode, or by absorbing the secondary photon emission.

Referring to FIG. 9, in a further embodiment, the passivation layer 70 includes an aperture 76 at a site along the layer 70. It can be preferred to provide such an aperture 76 at, e.g., a site along the material region 24. The aperture 76 extends through the thickness of the passivation layer 70. This aperture can be provided across an APD array by extending unbroken between rows of APDs in the array and extending unbroken between columns of APDs in the array.

The underfill 72 fills the aperture 70 through the extent of the passivation layer thickness and fully across the aperture at the aperture site. With the arrangement, any secondary photons that traverse the passivation layer 70 can be absorbed or reflected by the underfill 72. No unbroken path exists between neighboring photodiodes through the passivation layer 70. With an absorbing or reflective underfill 72, secondary photon emission is thereby blocked from each photodiode.

In another embodiment, shown in cross section in FIG. 10, the passivation layer 70 includes an aperture 76, and a cross talk blocking layer 74 is included between the passivation layer 70 and the underfill 72, extending across the aperture in the passivation layer 70. Here again, no unbroken path exists between neighboring photodiodes through the passivation layer 70; a photon path through the passivation layer necessarily includes the cross talk blocking layer 74 at the site of the aperture 76. Further, no photon path exists through the underfill without at least one traversal of the blocking layer 74. The cross talk blocking layer 74 includes one or more materials that either absorb or that reflect at least a range of wavelengths of secondary photons that are emitted from photodiodes. As a result, secondary photon emission is effectively completely blocked across an APD array with this arrangement including the cross talk material region 24 as well as the cross talk blocking layer 74.

Turning to microfabrication of an APD array, it has been discovered that an APD array can be efficiently microfabricated to produce an APD array that is devoid of a microfabrication substrate. The general steps of one embodiment of such a microfabrication process are shown in FIGS. 11A-11D. In a first sequence of steps, the result of which is shown in cross-section in FIG. 11A, an epitaxial growth substrate 100 is provided in the conventional manner. On one face of the substrate there is formed a layer 102 that is to provide the material regions 24 of the final APD array. Layers 104 are then formed as a stack of materials that are to provide the active layers of the array APDs. Epitaxial growth, physical or vapor deposition, or other suitable layer formation process can here be employed.

Figure 11A:
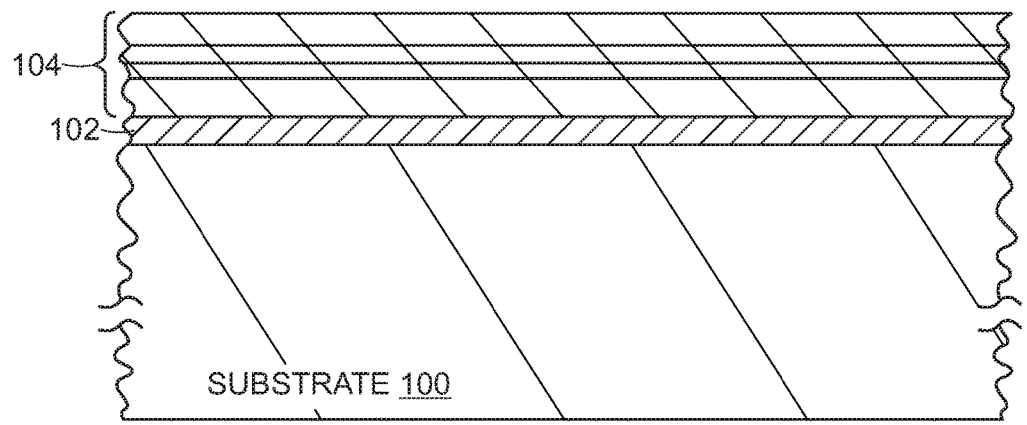
FIGS. 11A-11D are schematic cross-sectional side views of neighboring avalanche photodiodes in an array of photodiodes as the photodiodes are fabricated in a first example fabrication process.
Figure 11B:
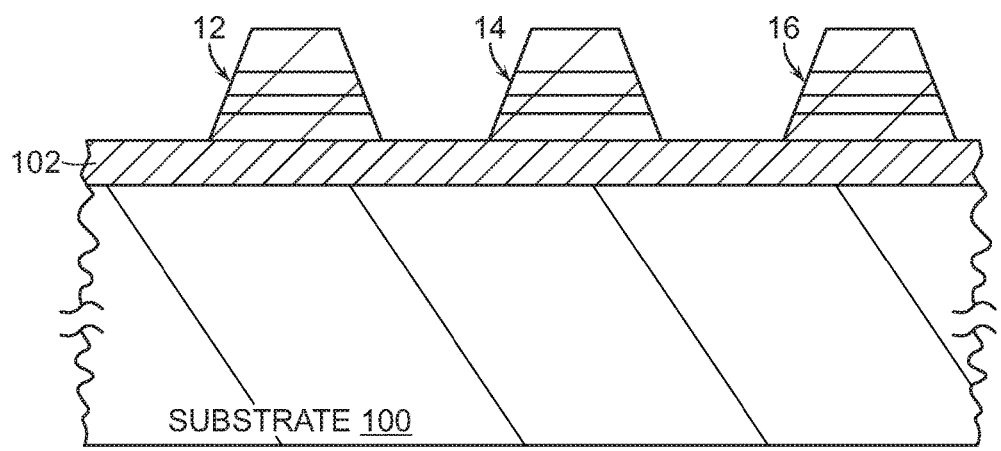

As shown in cross-section in FIG. 11B, the stack of layers 104 is then patterned and etched to produce each laterally isolated photodiode 12, 14, 16. The resulting photodiodes can have any selected lateral geometry, e.g., generally circular, generally rectangular, or other selected lateral geometry. Wet etching, dry etching, a combination of etching, or other process can here be employed to produce each isolated photodiode from the stack of layers 104.

Figure 11C:
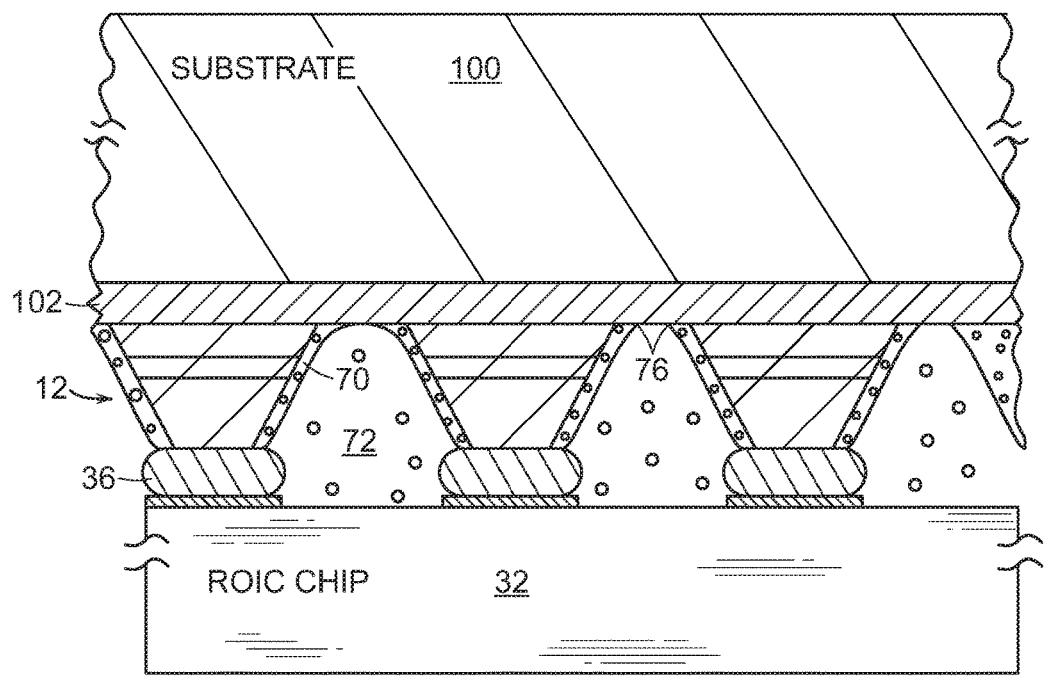

Turning to FIG. 11C, in which the structure is here shown flipped upside down in orientation from that of FIGS. 11A-11B, the photodiodes of the APD array are bonded to a ROIC chip 32, e.g., through bond pads 36. A selected passivation layer 70 and underfill 72 is provided in the manner described above. In the example embodiment shown in FIG. 11C, the passivation layer includes an aperture 76 that no continuous path for secondary photons exists through the passivation layer between neighboring photodiodes.

Figure 11D:
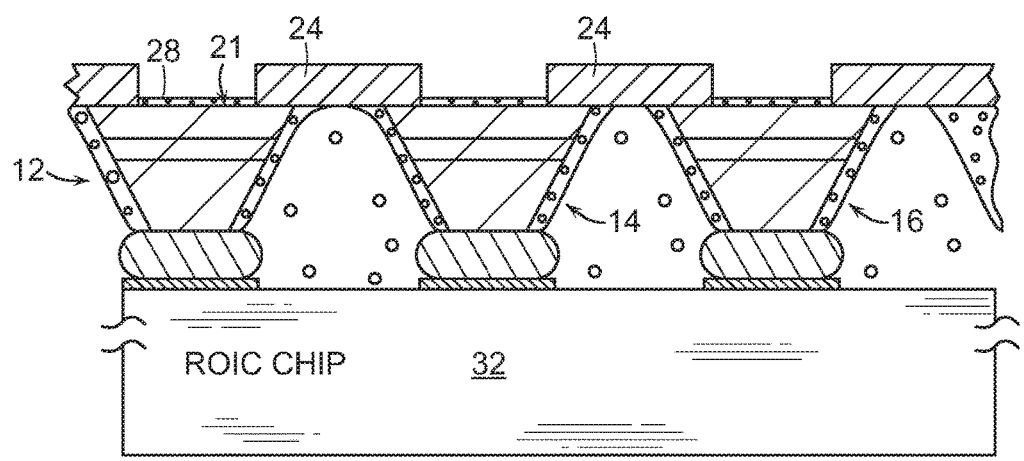

In a next sequence of steps, the result of which is shown in cross section in FIG. 11D, the substrate 100 is completely removed from the layer 102. No substrate remains. The layer 102 is then patterned and etched to provide in the layer an array of apertures like that shown in FIG. 2B, so that material regions 21 exist between photodiodes and slightly overlap laterally with each photodiode. An antireflection coating 28 is provided on the optical interface surface 21 of each photodiode. A microlens can then be mated with the APD array if desired.

This sequence of process steps demonstrates that an array of photodiodes can be microfabricated and mated to an integrated circuit chip with complete removal of the microfabrication substrate. The resulting APD array, like that shown in FIG. 2B, does not include any remnant of the microfabrication substrate that is employed, during processing for, e.g., epitaxial growth of the photodiode active layers during the processing.

Figure 12A:
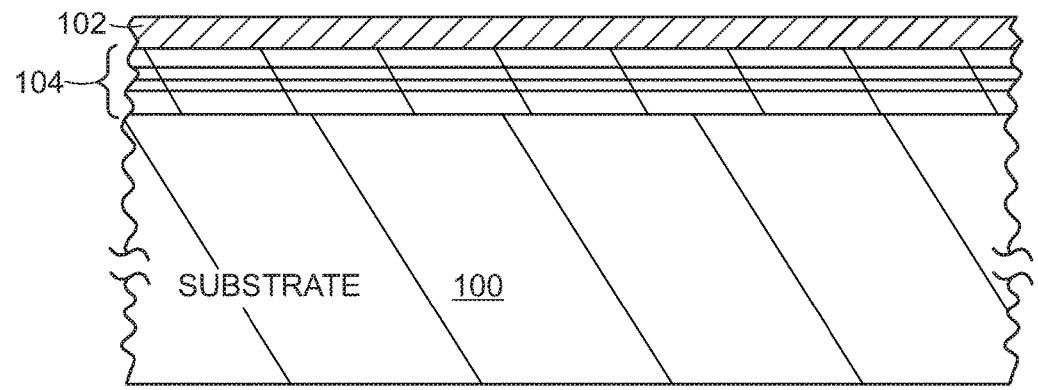
FIGS. 12A-12E are schematic cross-sectional side views of neighboring avalanche photodiodes in an array of photodiodes as the photodiodes are fabricated in a second example fabrication process.
Figure 12B:
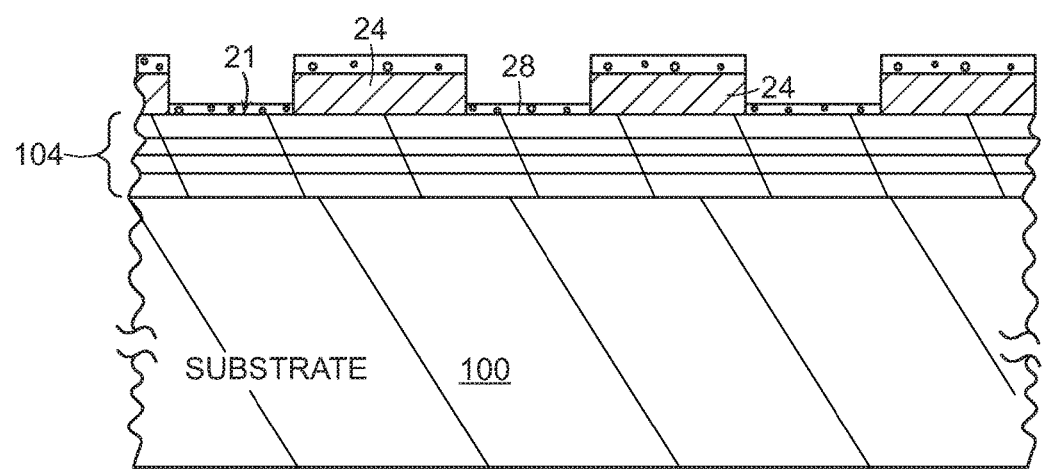

The general steps of a further embodiment of an APD microfabrication process are shown in FIGS. 12A-12B. In a first sequence of steps, the result of which is shown in cross-section in FIG. 12A, an epitaxial growth substrate 100 is provided in the conventional manner. On one face of the substrate there is formed a stack 104 of materials that are to provide the active layers of the APDs in the APD array. The stack is vertically arranged in the reverse order to the order of layers specified for the final APD structure. A layer 102 is then formed to provide the material regions 24 of the final APD array. Epitaxial growth, physical or vapor deposition, or other suitable layer formation process can here be employed.

As shown in cross-section in FIG. 12B, the layer 102 is then patterned and etched to provide in the layer an array of apertures like that shown in FIG. 2B. An antireflection coating layer is then provided on the exposed optical interface surface 21 at the site for each photodiode, as well as on the material regions 24.

Figure 12C:
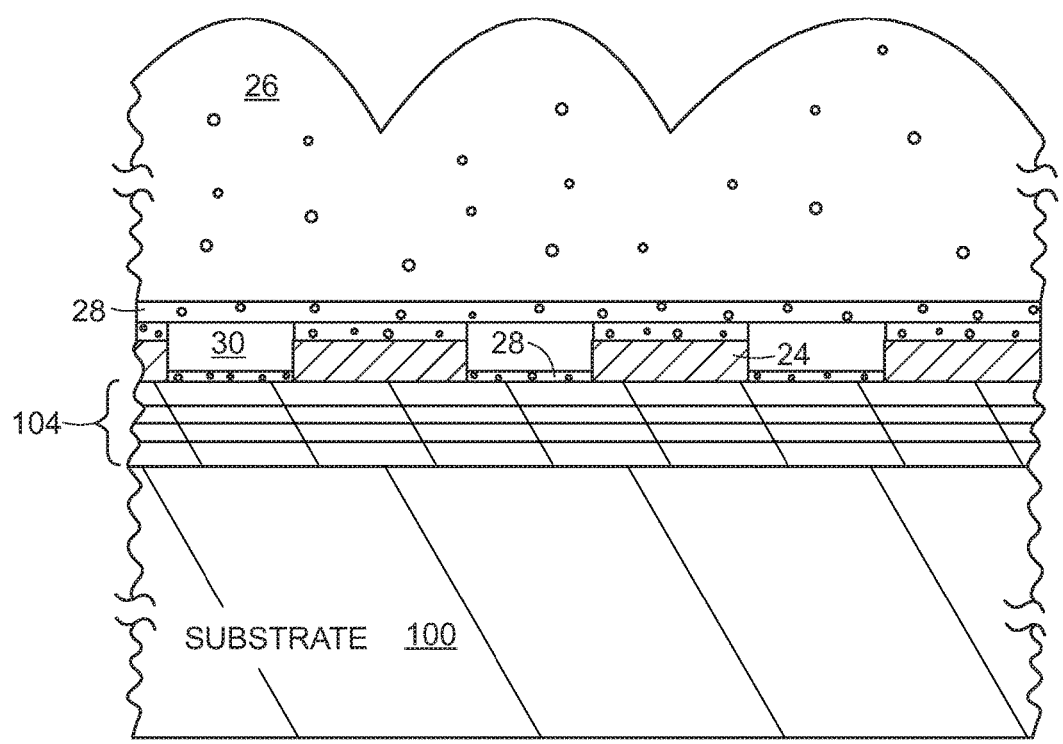

As shown in FIG. 12C, the material regions 24 are then bonded to the microlens array 26, on which has been provided an antireflection coating layer 28. Any suitable bonding method, such as oxide-to-oxide bonding and bonding apparatus, can be employed. With this bonding step, air gaps 30 are produced between the sites of photodiodes and the microlens. If such air gaps are not desired, then the air gaps can be filled with a selected material, preferably which is transparent to incident radiation to be detected by the photodiodes.

Figure 12D:
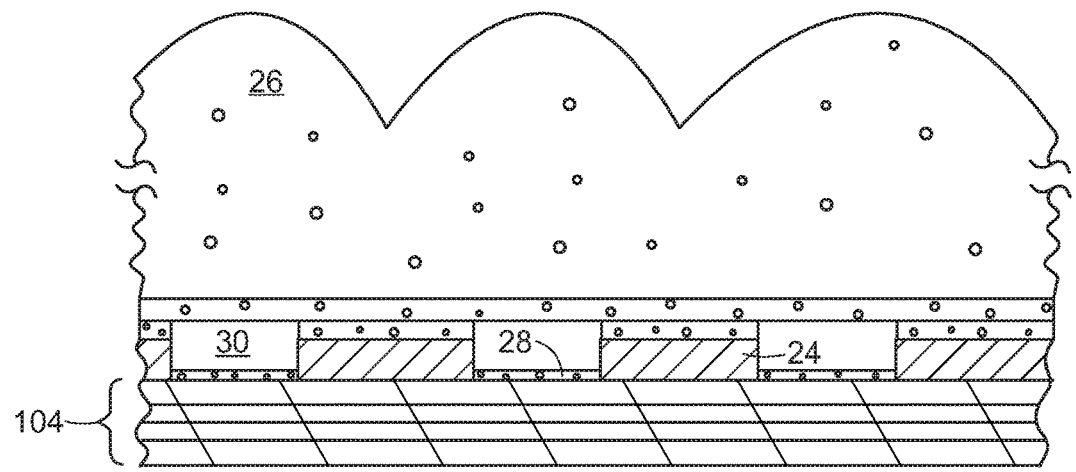
Figure 12E:
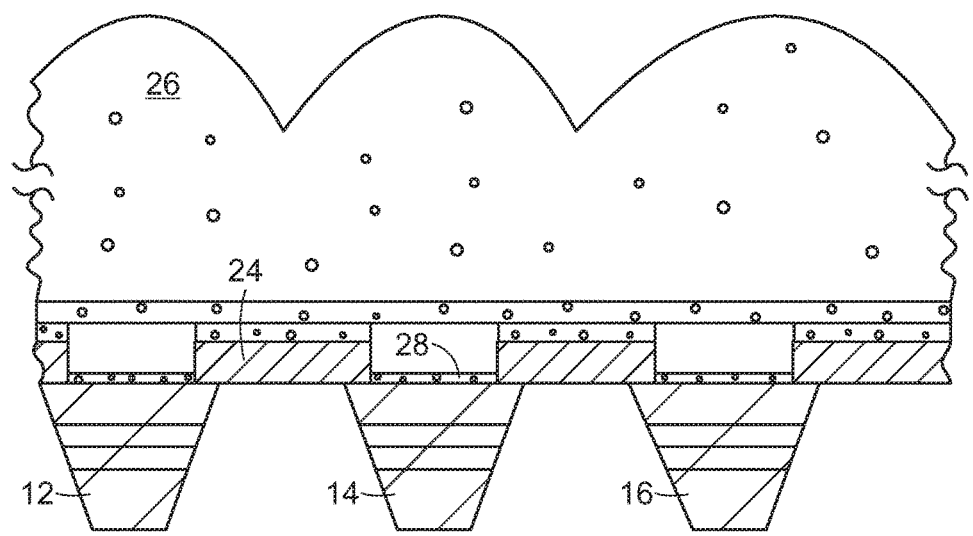

Turning to FIG. 12D, the substrate 100 is completely removed from the stack of layers 104. No substrate remains. The stack of layers 101 is then patterned and etched to produce each laterally isolated photodiode 12, 14, 16 as shown in FIG. 12E. The photodiodes can then be passivated and bonded to a ROIC chip as in FIG. 11D, with a selected underfill and passivation arrangement such as that shown in FIG. 11D.

These two example fabrication processes demonstrate that an APD array of physically isolated photodiodes can be produced with complete removal of a microfabrication substrate. The resulting array of APDs exhibits only very minimal optical crosstalk between photodiodes of the array. No particular microfabrication processing sequence is required, and any suitable process can be employed. The microfabrication sequences demonstrated in FIGS. 11A-D and FIGS. 12A-E are particularly elegant and efficient for producing an APD array that is in-place with a microlens array or integrated circuit chip. In one process, shown in FIGS. 11A-11D, the integrated circuit chip serves as a handle wafer, and in the other process, shown in FIGS. 12A-12E, the microlens array serves as a handle wafer, both for removal of a microfabrication substrate on which the APD active layers are epitaxially grown. These example processes demonstrate that varied approaches can be employed to produce the APD array that does not include a microfabrication substrate.

Additionally, the substrate-free APD array can be produced with die-scale attachment, e.g., between an individual APD array die and an ROIC chip, as in FIG. 11C, or can be conducted with wafer-scale bonding, e.g., wafer-scale bonding of a microlens array to the cross-talk blocking layer material region 24 as in FIG. 12D. Alternatively, there can be employed sacrificial handle wafers or other support structures that facilitate the removal of a substrate from the APD array without the use of a chip or a microlens array.

EXAMPLE

An APD array was microfabricated with the photodiode active layer specifications shown in FIG. 5. The InP layer 50 had a thickness of about 10,000 Å and was doped with Zn at a concentration of about $2e^{18}$ cm$^{-3}$ to form, a p-type doped contact layer. A 5000 Å-thick layer of InP doped with Zn at a concentration of about $7e^{17}$ cm$^{-3}$ was formed to provide the p-type doped diffusion layer 52. An avalanche multiplying layer 20, of about 14,000 Å A in thickness, was formed with a carrier concentration, n, of $1e^{15}$ cm$^{-3}$. The field stop layer 54 was formed as an InP layer of about 730 Å in thickness, doped, with Si at a concentration of about $3.4e^{17}$ cm$^{-3}$. The grading layer 56 was a 500 Å-thick InGaAsP layer having a carrier concentration of about $6e^{14}$ cm$^{-3}$. The photodiode absorber layer 18 was formed as a layer of InGaAsP of about 15,000 Å thickness and having a carrier concentration of about $6e^{14}$ cm$^{-3}$. The contact layer 58 was provided as InP that was Si-doped with a concentration of about $2e^{18}$ cm$^{-3}$. The electrical contact layer 35 was provided at the signal output surface 23 of this InP layer 58, as a 100 Å-thick layer of InGaAs that was Si-doped at a concentration greater than $2e^{18}$ cm$^{-3}$. The cross talk blocking layer 24 was provided as a 20,000 Å-layer of GaInAs that was Zn-doped at a concentration of about $2e^{18}$ cm$^{-3}$. With this doping level the cross talk blocking layer 24 was employed as an electrical connection to each photodiode.

An indium phosphide wafer was employed as the substrate for epitaxial growth of the photodiode layers. The micro fabrication process shown in FIGS. 11A-11D was employed to produce the APD array, with In bumps disposed on the photodiodes and NiAu bumps disposed on bond pads of the integrated circuit chip for making connection between each photodiode and the chip. Coatings of polyimide and silicon nitride were disposed as a passivation layer, and a cross talk blocking material EpoTek 320 was employed as an underfill between the APD array and the chip, in the arrangement shown in FIG. 7.

Figure 13:
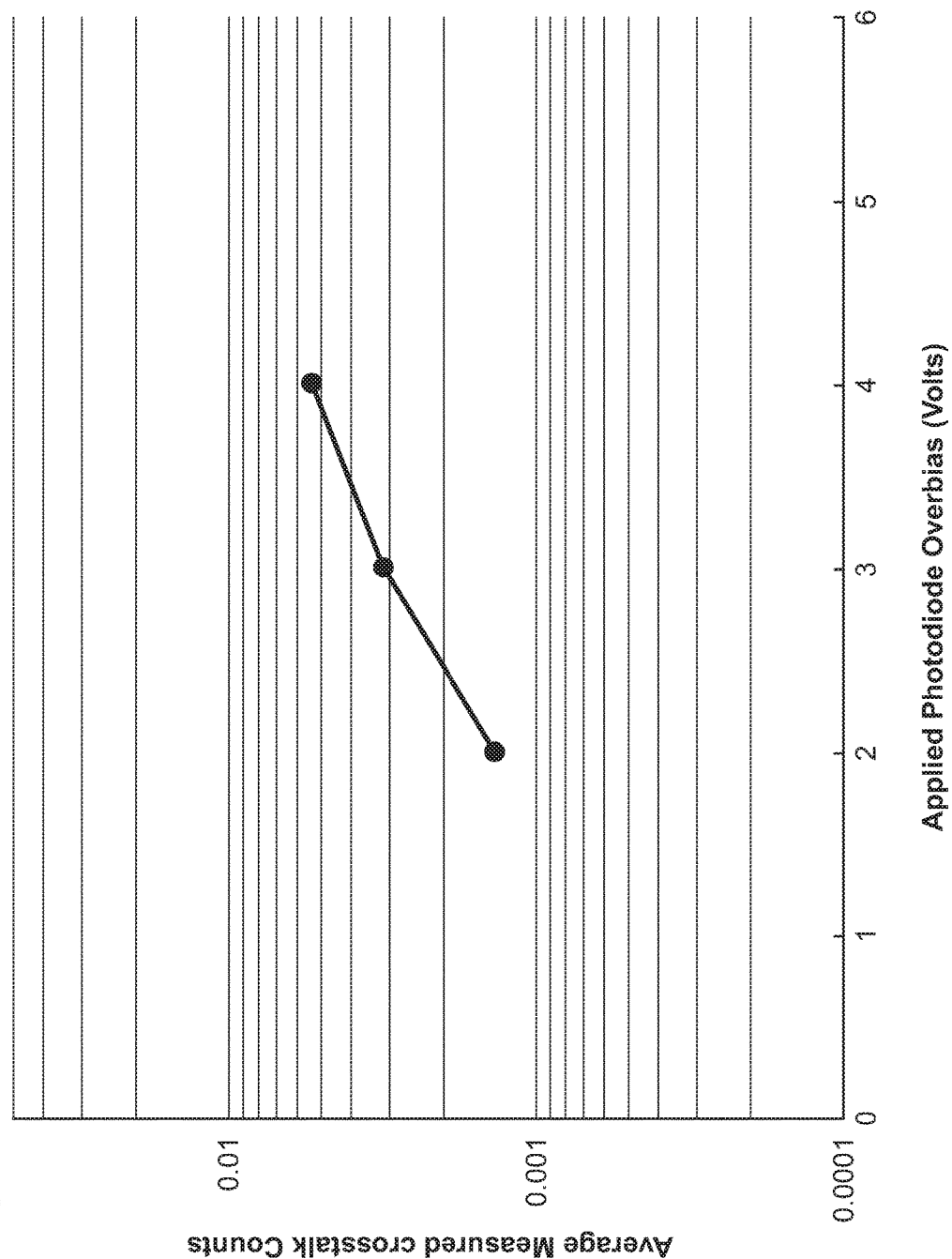
FIG. 13 is a plot of the average measured counts of cross talk as a function of applied over bias measured for an experimental Geiger-mode avalanche photodiode array.

FIG. 13 is a plot of the average number of optical cross talk events that were counted due to an avalanching photodiode in Geiger-mode as a function of the applied over bias for one of the photodiodes in the array. Over eight million photodiode avalanche events were controllably initiated and the number of resulting cross talk events counted. Over the entire population of trigger events, an average of 0.006 cross talk events occurred for each triggered avalanche event, even for an over bias of 4 V. This remarkably low level of optical cross talk is more than three orders of magnitude less than that of conventional APD array operation and is a dramatic demonstration of almost zero cross talk, a condition that was not historically thought to be achievable.

The cross talk blocking arrangement of the APD array can be applied to photodiodes of any selected material system, such as a silicon-based material system, in III-V material systems, other II-VI systems, or other suitable material systems, and is not limited to a particular material system. In any of these materials, the photodiode array provided herein enables optimal photodiode performance for a wide range of important applications.

It is recognised, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:
1. An avalanche photodiode array comprising:
   a plurality of avalanche photodiodes, each avalanche photodiode including a stack of active photodiode materials comprising:
   a first electrical contact layer;
   a second electrical contact layer;
   an absorber material layer and an avalanche material layer each disposed between the first electrical contact layer and the second electrical contact layer; and
   an optical interface surface to the avalanche photodiode, the optical interface surface consisting of an exposed surface of the first electrical contact layer, arranged for incident external radiation to directly enter the first electrical contact layer and coated with an antireflection coating to facilitate entrance of external incident radiation into the first electrical contact layer; and
   wherein each avalanche photodiode stack of active photodiode materials is laterally isolated from the other avalanche photodiodes in the photodiode array.

2. The avalanche photodiode array of claim 1 further comprising a cross talk blocking region disposed laterally adjacent to each avalanche photodiode in the array, between laterally isolated stacks of active photodiode material, maintaining an exposed surface of the first electrical contact layer of each avalanche photodiode in the array, the cross talk blocking region comprising a cross talk blocking material that exhibits a condition selected from the group consisting of absorption of secondary photons produced by avalanche photodiodes in the array and reflection of secondary photons produced by avalanche photodiodes in the array.

3. The avalanche photodiode array of claim 2 wherein the cross talk blocking region is electrically conducting and is in electrical contact with the exposed surface of the first electrical contact layer of each avalanche photodiode in the array.

4. The avalanche photodiode array of claim 3 wherein the cross talk blocking material layer comprises a metal layer.

5. The avalanche photodiode array of claim 3 wherein the cross talk blocking material layer comprises a doped semiconducting layer.

6. The avalanche photodiode array of claim 2 wherein the cross talk blocking region comprises a material layer that laterally overlaps edges of the exposed surface of the first electrical contact layer of each avalanche photodiode in the array.

7. The avalanche photodiode array of claim 2 wherein the cross talk blocking region comprises a cross talk blocking passivation layer disposed on sidewalls of each avalanche photodiode stack of active photodiode materials.

8. The avalanche photodiode array of claim 2 wherein the cross talk blocking region comprises a cross talk blocking underfill material that is disposed between each avalanche photodiode stack of active photodiode materials.

9. The avalanche photodiode array of claim 2 wherein the cross talk blocking region comprises a cross talk blocking layer extending down a sidewall of each avalanche photodiode stack of active photodiode materials.

10. The avalanche photodiode array of claim 9 wherein the cross talk blocking layer comprises an electrically conducting material layer in each avalanche photodiode that makes an electrical connection to the first electrical contact layer of that avalanche photodiode.

11. The avalanche photodiode array of claim 2 further comprising a passivation layer disposed on sidewalls of each avalanche photodiode stack of active photodiode materials, and wherein the cross talk blocking region comprises a cross talk blocking layer that is disposed on the passivation layer.

12. The avalanche photodiode array of claim 11 wherein the passivation layer includes an aperture between each avalanche photodiode stack of active photodiode materials, and wherein the crosstalk blocking layer disposed on the passivation layer fills each aperture.

13. The avalanche photodiode array of claim 1 further comprising an electrically conducting electrical contact layer disposed laterally adjacent to each avalanche photodiode in the array, between laterally isolated stacks of active photodiode material, maintaining an exposed surface of and making electrical contact to the first electrical contact layer of each avalanche photodiode in the array.

14. The avalanche photodiode array of claim 1 further comprising an array of microlenses, each microlens disposed in an optical path with the optical interface surface of an avalanche photodiode in the array of avalanche photodiodes for focusing incident external radiation to the exposed surface of the first electrical contact layer of each avalanche photodiode in the array of avalanche photodiodes.

15. The avalanche photodiode array of claim 14, further comprising a cross talk blocking region disposed laterally adjacent to each avalanche photodiode in the array, between laterally isolated stacks of active photodiode material, maintaining an exposed surface of the first electrical contact layer of each avalanche photodiode in the array, the cross talk blocking region comprising a cross talk blocking material that exhibits a condition selected from the group consisting of absorption of secondary photons produced by avalanche photodiodes in the array and reflection of secondary photons produced by avalanche photodiodes in the array, and wherein the array of microlenses is disposed adjacent to the cross talk region for focusing incident external radiation to the exposed surface of the first electrical contact layer of each avalanche photodiode in the array.

16. The avalanche photodiode array of claim 1 further comprising:
a cross talk blocking region disposed laterally adjacent to each avalanche photodiode in the array, between laterally isolated stacks of active photodiode material, maintaining an exposed surface of the first electrical contact layer of each avalanche photodiode in the array, the cross talk blocking region comprising a cross talk blocking material that exhibits a condition selected from the group consisting of absorption of secondary photons produced by avalanche photodiodes in the array and reflection of secondary photons produced by avalanche photodiodes in the array;
a passivation layer disposed on sidewalls of each avalanche photodiode stack of active photodiode materials; and an underfill material disposed between each avalanche photodiode stack of active photodiode materials, over the passivation layer;
wherein at least one of the passivation layer and the underfill material comprises a cross talk blocking material that exhibits a condition selected from the group consisting of absorption of secondary photons produced by avalanche photodiodes in the array and reflection of secondary photons produced by avalanche photodiodes in the array.

17. The avalanche photodiode array of claim 16 wherein the cross talk blocking region comprises a cross talk blocking material layer that makes electrical connection to the first electrical contact layer of each avalanche photodiode in the array.

18. The avalanche photodiode array of claim 17 further comprising an array of microlenses, each microlens disposed adjacent to the cross talk blocking material layer, in an optical path with the optical interface surface of an avalanche photodiode in the array of avalanche photodiodes, for focusing incident external radiation to the exposed surface of the first electrical contact layer of each avalanche photodiode in the array of avalanche photodiodes.

19. An avalanche photodiode array comprising:
a plurality of avalanche photodiodes, each avalanche photodiode including a stack of active photodiode materials comprising:
a first electrical contact layer comprising indium phosphide;
a second electrical contact layer;
an absorber material layer and an avalanche material layer each disposed between the first electrical contact layer and the second electrical contact layer, wherein the avalanche material layer comprises indium phosphide, and the absorber material layer comprises InGaAsP, and
an optical interface surface to the avalanche photodiode, the optical interface surface consisting of an exposed surface of the first electrical contact layer, arranged for incident external radiation to directly enter the first electrical contact layer;
wherein each avalanche photodiode stack of active photodiode materials is laterally isolated from the other avalanche photodiodes in the photodiode array; and
a cross talk blocking region disposed laterally adjacent to each avalanche photodiode in the array, between laterally isolated stacks of active photodiode material, maintaining an exposed surface of the first electrical contact layer of each avalanche photodiode in the array, the cross talk blocking region comprising GaInAs.

20. A method for manufacturing an array of avalanche photodiodes comprising:
forming on a substrate a layer of cross talk blocking material that blocks transmission of photons through the cross talk blocking material;
forming a stack of active photodiode layers on the cross talk blocking material layer, the stack of active photodiode layers including a first electrical contact layer, an absorber layer, an avalanche layer, and a second electrical contact layer;
removing regions of the stack of active photodiode layers through a full thickness of the layers, at sites across the substrate, to form an array of laterally isolated avalanche photodiodes, each avalanche photodiode being isolated laterally from the other avalanche photodiodes in the array by the removal of regions of the stack of active photodiode layers;

electrically connecting one of the electrical contact layers of each avalanche photodiode in the array to an individual contact pad of a microelectronic chip;

completely removing the substrate on which the stack of active photodiode layers was formed, producing an array of laterally isolated avalanche photodiodes devoid of a substrate; and removing regions of the cross talk blocking material layer at each avalanche photodiode to expose an optical interface surface at each avalanche photodiode in the array.

21. The method of claim 20 further comprising forming an antireflection coating on the optical interface surface of each avalanche photodiode.

22. The method of claim 20 further comprising coating sidewalls of each isolated avalanche photodiode stack of active photodiode layers with a planarization layer and providing an underfill material between the array of avalanche photodiodes and the microelectronic chip, at least one of the planarization layer and the underfill material being a material that blocks transmission of photons.

23. The method of claim 20 further comprising:
coating each isolated avalanche photodiode with a planarization layer;
forming a cross talk blocking planarization material layer on the planarization layer, the cross talk blocking planarization material being a material that blocks transmission of photons; and
providing an underfill material between the array of avalanche photodiodes and the microelectronic chip.

24. The method of claim 23 further comprising forming an aperture in the planarization layer at a site between each photodiode, the cross talk blocking planarization material layer filling the aperture.

25. A method for manufacturing an array of avalanche photodiodes comprising:
forming a stack of active photodiode layers on a substrate, the stack of active photodiode layers including a first electrical contact layer, an absorber layer, an avalanche layer, and a second electrical contact layer;
forming on the stack of active photodiode layers a layer of cross talk blocking material that blocks transmission of photons through the cross talk blocking material;
removing the cross talk blocking material layer at a plurality of sites on the stack of active photodiode layers to expose avalanche photodiode optical interface surface sites for an array of avalanche photodiodes;
bonding the cross talk blocking material layer to a microlens array aligned with the plurality of optical interface surface sites;
completely removing the substrate on which the stack of active photodiode layers was formed, producing an array of avalanche photodiode sites devoid of a substrate; and
removing regions of the stack of active photodiode layers through a full thickness of the layers, at the optical interface surface sites across the substrate, to form an array of laterally isolated avalanche photodiodes, each avalanche photodiode being isolated laterally from the other avalanche photodiodes in the array by the removal of regions of the stack of active photodiode layers.

26. The method of claim 25 further comprising forming an oxide layer on the microlens array and forming an oxide layer on the cross talk blocking material layer for bonding the cross talk blocking material layer to the microlens array through the oxide layers.

27. The method of claim 25 further comprising electrically connecting one of the electrical contact layers of each avalanche photodiode in the array to an individual contact pad of a microelectronic chip.

28. The method of claim 27 further comprising coating each isolated avalanche photodiode with a planarization layer and providing an underfill material between the array of avalanche photodiodes and the microelectronic chip, at least one of the planarization layer and the underfill material being a material that blocks transmission of photons.

29. The method of claim 27 further comprising:
coating each isolated avalanche photodiode with a planarization layer;
forming an aperture in the planarization layer at a site between each photodiode,
forming a cross talk blocking planarization material layer on the planarization layer, the cross talk blocking planarization material being a material that blocks transmission of photons and the cross talk blocking planarization material layer filling the aperture; and
providing an underfill material between the array of avalanche photodiodes and the microelectronic chip.

* * * * *